US010739683B2

(12) United States Patent
Sato

(10) Patent No.: US 10,739,683 B2
(45) Date of Patent: Aug. 11, 2020

(54) LIQUID IMMERSION MEMBER, EXPOSURE APPARATUS, EXPOSING METHOD, METHOD FOR MANUFACTURING DEVICE, PROGRAM, AND RECORDING MEDIUM

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/013,306

(22) Filed: Jun. 20, 2018

(65) Prior Publication Data

US 2018/0314166 A1    Nov. 1, 2018

Related U.S. Application Data

(63) Continuation of application No. 14/597,536, filed on Jan. 15, 2015, now Pat. No. 10,007,189, which is a continuation of application No. PCT/JP2013/069959, filed on Jul. 16, 2013.

(60) Provisional application No. 61/790,328, filed on Mar. 15, 2013, provisional application No. 61/674,078, filed on Jul. 20, 2012.

(51) Int. Cl.
*G03F 7/20* (2006.01)

(52) U.S. Cl.
CPC ................ *G03F 7/70341* (2013.01)

(58) Field of Classification Search
CPC .................................................. G03F 7/70341
See application file for complete search history.

(56) References Cited

U.S. PATENT DOCUMENTS

| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,452,292 | B1 | 9/2002 | Binnard |
| 6,611,316 | B2 | 8/2003 | Sewell |

(Continued)

FOREIGN PATENT DOCUMENTS

| EP | 1 713 113 A1 | 10/2006 |
| JP | 2010-135794 A | 6/2010 |

(Continued)

OTHER PUBLICATIONS

Sep. 27, 2013 International Search Report issued in International Patent Application No. PCT/JP2013/069959.

(Continued)

*Primary Examiner* — Michelle M Iacoletti
(74) *Attorney, Agent, or Firm* — Oliff PLC

(57) ABSTRACT

A liquid immersion member is used in a liquid immersion exposure apparatus, and forms a liquid immersion space above an object which is movable below the optical member. The liquid immersion member includes a first member that is disposed at at least a portion of surrounding of the optical member, and a second member that is disposed at at least a portion of surrounding of an optical path of the exposure light and is relatively movable with respect to the first member. The second member includes a second upper surface that is opposite to a first lower surface of the first member via a gap, a second lower surface that is capable of being opposite to the object, and a fluid recovery part that is disposed at at least a portion of surrounding of the second lower surface.

30 Claims, 21 Drawing Sheets

(56) References Cited

U.S. PATENT DOCUMENTS

| | | |
|---|---|---|
| 6,778,257 B2 | 8/2004 | Bleeker et al. |
| 6,897,963 B1 | 5/2005 | Taniguchi et al. |
| 7,292,313 B2 | 11/2007 | Poon et al. |
| 7,656,501 B2 | 2/2010 | Kate et al. |
| 7,705,966 B2 | 4/2010 | Sakai et al. |
| 7,804,577 B2 | 9/2010 | Leenders et al. |
| 7,864,292 B2 | 1/2011 | Leenders et al. |
| 8,004,651 B2 | 8/2011 | Nagasaka |
| 8,068,209 B2 | 11/2011 | Poon et al. |
| 8,134,685 B2 | 3/2012 | Nishii et al. |
| 8,237,911 B2 | 8/2012 | Poon et al. |
| 8,289,497 B2 | 10/2012 | Poon et al. |
| 8,400,610 B2 | 3/2013 | Poon et al. |
| 8,477,283 B2 | 7/2013 | Nishii |
| 8,675,174 B2 | 3/2014 | Mizutani |
| 8,743,343 B2 | 6/2014 | Poon et al. |
| 8,891,059 B2 | 11/2014 | Nagasaka |
| 8,896,806 B2 | 11/2014 | Sato |
| 8,934,080 B2 | 1/2015 | Poon et al. |
| 9,013,675 B2 | 4/2015 | Nishii et al. |
| 9,927,724 B2 | 3/2018 | Sato |
| 10,007,189 B2 * | 6/2018 | Sato .................. G03F 7/70341 |
| 2007/0109512 A1 | 5/2007 | Kate et al. |
| 2007/0109513 A1 | 5/2007 | Antonius Leenders et al. |
| 2007/0110213 A1 | 5/2007 | Leenders et al. |
| 2007/0177125 A1 | 8/2007 | Shibazaki |
| 2007/0288121 A1 | 12/2007 | Shibazaki |
| 2007/0291241 A1 | 12/2007 | Sakai et al. |
| 2008/0049209 A1 | 2/2008 | Nagasaka et al. |
| 2008/0231822 A1 | 9/2008 | Poon et al. |
| 2009/0231560 A1 | 9/2009 | Poon et al. |
| 2009/0237631 A1 | 9/2009 | Poon et al. |
| 2010/0328637 A1 | 12/2010 | Nishii |
| 2013/0188159 A1 | 7/2013 | Shibazaki |
| 2013/0265555 A1 | 10/2013 | Shibazaki |
| 2013/0265556 A1 | 10/2013 | Sato |
| 2014/0253886 A1 | 9/2014 | Sato |
| 2014/0285781 A1 | 9/2014 | Sato |
| 2014/0300875 A1 | 10/2014 | Sato et al. |
| 2014/0307235 A1 | 10/2014 | Sato |

FOREIGN PATENT DOCUMENTS

| | | |
|---|---|---|
| JP | 2011-205121 A | 10/2011 |
| KR | 10-2007-0119547 A | 12/2007 |
| KR | 10-2010-0023036 A | 3/2010 |
| WO | 01/35168 A1 | 5/2001 |
| WO | 2004/019128 A2 | 3/2004 |
| WO | 2007/057673 A1 | 5/2007 |
| WO | 2009/119898 A1 | 10/2009 |
| WO | 2011/083724 A1 | 7/2011 |

OTHER PUBLICATIONS

Sep. 27, 2013 Written Opinion issued in International Patent Application No. PCT/JP2013/069959.
U.S. Appl. No. 13/940,685, filed Jul. 12, 2013 in the name of Sato.
U.S. Appl. No. 14/597,536, filed Jan. 15, 2015 in the name of Sato.
Aug. 6, 2015 Office Action issued in U.S. Appl. No. 13/940,685.
Nov. 5, 2015 Office Action issued in U.S. Appl. No. 13/940,685.
Nov. 23, 2015 Office Action issued in Chinese Patent Application No. 201380038451.8.
Apr. 25, 2016 Office Action issued in U.S. Appl. No. 13/940,685.
Oct. 5, 2016 Office Action issued in U.S. Appl. No. 13/940,685.
Nov. 29, 2016 Office Action issued in Japanese Patent Application No. 2013-053321.
May 11, 2017 Office Action issued in U.S. Appl. No. 14/597,536.
Apr. 4, 2017 Office Action issued in Japanese Application No. 2015-522464.
Apr. 24, 2017 Office Action issued in Taiwanese Application No. 102125369.
Apr. 12, 2017 Office Action issued in U.S. Appl. No. 13/940,685.
Sep. 28, 2017 Office Action issued in U.S. Appl. No. 14/597,536.
Apr. 24, 2019 Office Action issued in Chinese Patent Application No. 201710675381.7.
Jul. 18, 2019 Office Action issued in Korean Patent Application No. 10-2015-7003887.

* cited by examiner (A)

(B)

(C)

LIQUID IMMERSION MEMBER, EXPOSURE APPARATUS, EXPOSING METHOD, METHOD FOR MANUFACTURING DEVICE, PROGRAM, AND RECORDING MEDIUM

CROSS-REFERENCE TO RELATED APPLICATION

This application is a continuation application of U.S. patent application Ser. No. 14/597,536, filed Jan. 15, 2015, which is a continuation application of International Patent Application No. PCT/JP2013/069959, filed on Jul. 16, 2013. In view of this, priority is also claimed to U.S. Provisional Application No. 61/674,078, filed Jul. 20, 2012, and U.S. Provisional Application No. 61/790,328, filed Mar. 15, 2013. The contents of each of the above applications are incorporated herein by reference.

BACKGROUND

The present invention relates to a liquid immersion member, an exposure apparatus, an exposing method, a method for manufacturing a device, a program, and a recording medium.

For example, in an exposure apparatus which is used in a photolithography process, as disclosed in U.S. Pat. No. 7,864,292, a liquid immersion exposure apparatus which exposes a substrate by exposure light via a liquid is known.

SUMMARY

For example, in a liquid immersion exposure apparatus, if a liquid flows out from a predetermined space or remains on an object such as a substrate, exposure failure may occur. As a result, a defective device may be manufactured.

An object of an aspect of the present invention is to provide a liquid immersion member, an exposure apparatus, and an exposing method capable of suppressing the occurrence of exposure failure. Moreover, another object of an aspect of the present invention is to provide a method for manufacturing a device, a program, and a recording medium capable of suppressing the occurrence of a defective device.

According to a first aspect of the present invention, there is provided a liquid immersion member that is used in a liquid immersion exposure apparatus which exposes a substrate via liquid between an emitting surface of an optical member and the substrate by exposure light, and that forms a liquid immersion space above an object which is movable below the optical member, the liquid immersion member including: a first member that is disposed at at least a portion of surrounding of the optical member, and that includes a first lower surface; and a second member that is disposed at at least a portion of surrounding of an optical path of the exposure light below the first member, and that is relatively movable with respect to the first member, wherein the second member includes: a second upper surface that is opposite to the first lower surface of the first member via a gap; a second lower surface that is capable of being opposite to the object; and a fluid recovery part that is disposed at at least a portion of surrounding of the second lower surface.

According to a second aspect of the present invention, there is provided a liquid immersion member that is used in a liquid immersion exposure apparatus which exposes a substrate via liquid between an emitting surface of an optical member and the substrate by exposure light, and that forms a liquid immersion space above an object which is movable below the optical member, the liquid immersion member including: a first member that is disposed at at least a portion of surrounding of the optical member, and that includes a first lower surface; a liquid recovery part; and a second member that is disposed at at least a portion of surrounding of an optical path of the exposure light, and that is relatively movable with respect to the first member, wherein the second member includes: a second upper surface that is opposite to the first lower surface of the first member via a gap; a second lower surface that is opposite to the object; and a fluid recovery part that is disposed at at least a portion of surrounding of the second lower surface, the liquid recovery part is capable of recovering a liquid from a first space between the first lower surface and the second upper surface, and the fluid recovery part is capable of recovering fluid from a second space between the second lower surface and the object.

According to a third aspect of the present invention, there is provided an exposure apparatus that exposes a substrate by exposure light via a liquid, including: the liquid immersion member according to the first aspect or the liquid immersion member according to the second aspect.

According to a fourth aspect of the present invention, there is provided a method for manufacturing a device, including the steps of: exposing a substrate using the exposure apparatus according to the third aspect; and developing the exposed substrate.

According to a fifth aspect of the present invention, there is provided a method for exposing a substrate via liquid between an emitting surface of an optical member and the substrate by exposure light, including the steps of: forming a liquid immersion space of the liquid above the substrate that is capable of moving below the optical member, using a liquid immersion member that includes a first member disposed at at least a portion of surrounding of the optical member, and a second member that is disposed at at least a portion of surrounding of an optical path of the exposure light below the first member and that includes a second upper surface opposite to a first lower surface of the first member via a gap, a second lower surface that is capable of being opposite to the substrate, and a fluid recovery part disposed at at least a portion of surrounding of the second lower surface; exposing the substrate by the exposure light emitted from the emitting surface via the liquid in the liquid immersion space; and moving the second member with respect to the first member in at least a portion of an exposure of the substrate.

According to a sixth aspect of the present invention, there is provided a method for manufacturing a device, including the steps of: exposing a substrate using the method for exposing according to the fourth aspect, and developing the exposed substrate.

According to a seventh aspect of the present invention, there is provided a program that causes a computer to execute a control of a liquid immersion exposure apparatus exposing a substrate by exposure light via liquid between an emitting surface of an optical member and the substrate, wherein the program performs: forming a liquid immersion space of the liquid above the substrate that is capable of moving below the optical member, using a liquid immersion member that includes a first member disposed at at least a portion of surrounding of the optical member, and a second member that is disposed at at least a portion of surrounding of an optical path of the exposure light below the first member and that includes a second upper surface opposite to a first lower surface of the first member via a gap, a second lower surface that is capable of being opposite to the substrate, and a fluid recovery part disposed at at least a portion of surrounding of the second lower surface; exposing the substrate by the exposure light emitted from the emitting surface via the liquid in the liquid immersion space; and relatively moving the second member with respect to the first member during at least a portion of the exposure of the substrate.

According to an eighth aspect of the present invention, there is provided a computer-readable recording medium on which the program according to the seventh aspect is recorded.

According to aspects of the present invention, the occurrence of exposure failure can be suppressed. In addition, according to the aspects of the present invention, the occurrence of a defective device can be suppressed.

DESCRIPTION OF EMBODIMENTS

Figure 1:
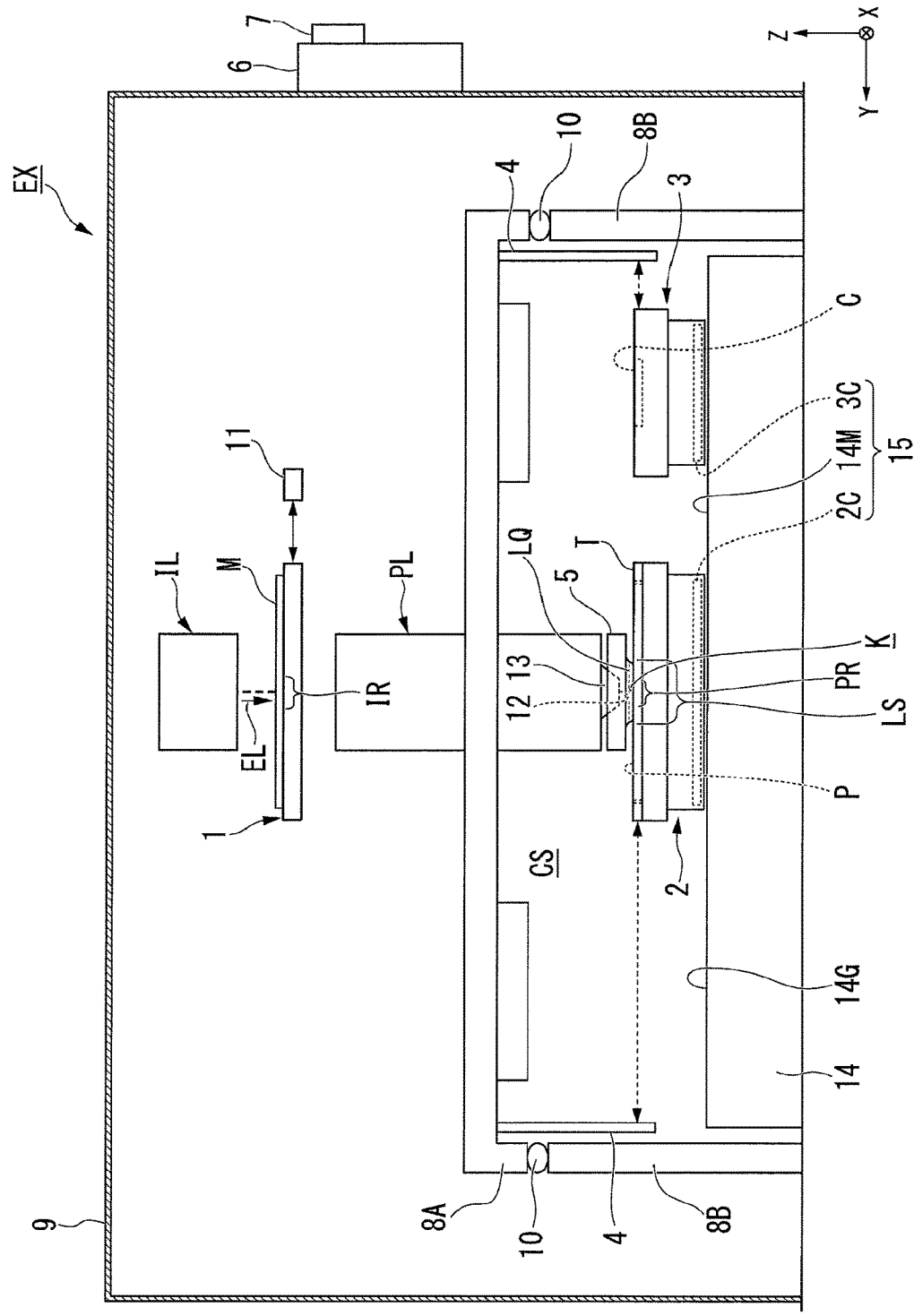
FIG. 1 is a view showing an example of an exposure apparatus according to a first embodiment.

Hereinafter, embodiments of the present invention will be described referring to the drawings. However, the present invention is not limited thereto. In the description below, an XYZ rectangular coordinate system is set, and a positional relationship of each portion will be described referring to the XYZ rectangular coordinate system. A predetermined direction in a horizontal surface is set to an X axis direction, a direction perpendicular to the X axis direction in the horizontal surface is set to a Y axis direction, and a direction (that is, a vertical direction) perpendicular to each of the X axis direction and the Y axis direction is set to a Z axis direction. Moreover, the rotation (inclination) directions around the X axis, the Y axis, and the Z axis are set to θX direction, θY direction, and θZ direction.

First Embodiment

A first embodiment will be described. FIG. 1 is a schematic configuration view showing an example of an exposure apparatus EX according to a first embodiment. The exposure apparatus EX of the present embodiment is a liquid immersion exposure apparatus which exposes a substrate P via a liquid LQ using exposure light EL. In the present embodiment, a liquid immersion space LS is formed so that an optical path K of the exposure light EL which is radiated to the substrate P is filled with the liquid LQ. The liquid immersion space LS means a portion (space or region) which is filled with the liquid. The substrate P is exposed by the exposure light EL via the liquid LQ in the liquid immersion space LS. In the present embodiment, water (pure water) is used for the liquid LQ.

Furthermore, for example, the exposure apparatus EX of the present embodiment is an exposure apparatus which includes a substrate stage and a measurement stage as disclosed in, for example, U.S. Pat. No. 6,897,963, European Patent Application, Publication No. 1713113, and the like.

In FIG. 1, the exposure apparatus EX includes: a mask stage 1 which is movable while holding a mask M; a substrate stage 2 which is movable while holding a substrate P; a measurement stage 3 which does not hold the substrate P, and which is movable while mounting a measurement member (measurement instrument) C which measures the exposure light EL; a measurement system 4 which measures positions of the substrate stage 2 and the measurement stage 3; an illumination system IL which illuminates the mask M with the exposure light EL; a projection optical system PL which projects an image of a pattern of the mask M which is illuminated with the exposure light EL to the substrate P; a liquid immersion member 5 which forms the liquid immersion space LS; a controller 6 which controls an operation of the entire exposure apparatus EX; and a storage apparatus 7 which is connected to the controller 6 and stores various information with respect to the exposure.

Furthermore, the exposure apparatus EX includes a reference frame 8A which supports the projection optical system PL and various measurement systems including the measurement system 4, an apparatus frame 8B which supports the reference frame 8A, and a vibration isolator 10 which is disposed between the reference frame 8A and the apparatus frame 8B, and suppresses transmission of vibration from the apparatus frame 8B to the reference frame 8A. The vibration isolator 10 includes a spring apparatus or the like. In the present embodiment, the vibration isolator 10 includes a gas spring (for example, air mount). Moreover, a detection system which detects an alignment mark of the substrate P or a detection system which detects the position of the surface of the object such as the substrate P may be supported by the reference frame 8A.

Furthermore, the exposure apparatus EX includes a chamber apparatus 9 which adjusts an environment (at least one of temperature, humidity, pressure, and a degree of cleanness) of a space CS to which the exposure light EL advances. At least the projection optical system PL, the liquid immersion member 5, the substrate stage 2, and the measurement stage 3 are disposed in the space CS. In the present embodiment, at least a portion of the mask stage 1 and the illumination system IL is also disposed in the space CS.

The mask M includes a reticle on which a device pattern projected to the substrate P is formed. For example, the mask M includes a transmission type mask which includes a transparent plate such as a glass plate, and a pattern formed on the transparent plate using a light-shielding material such as chromium. Moreover, a reflection type mask may be used for the mask M.

The substrate P is a substrate for manufacturing a device. For example, the substrate P includes a base material such as a semiconductor wafer and a photosensitive film which is formed on the base material. The photosensitive film is a film of a photosensitive material (photoresist). Furthermore, the substrate P may include another film in addition to the photosensitive film. For example, the substrate P may include an antireflection film and a protective film (top coat film) which protects the photosensitive film.

The illumination system IL radiates the exposure light EL to an illumination region IR. The illumination region IR includes positions which can be irradiated with the exposure light EL emitted from the illumination system IL. The illumination system IL illuminates at least a portion of the mask M disposed in the illumination region IR by the exposure light EL having a uniform illumination distribution. For example, as for the exposure light EL which is emitted from the illumination system IL, far-ultraviolet light (DUV light) such as a bright line (g-line, h-line, i-line) emitted from a mercury lamp and KrF excimer laser light (248 nm in wavelength), ArF excimer laser light (193 nm in wavelength), vacuum-ultraviolet light (VUV light) such as $F_2$ laser light (157 nm in wavelength), and the like are used. In the present embodiment, as for the exposure light EL, ArF excimer laser light, which is ultraviolet light (vacuum-ultraviolet light), is used.

The mask stage 1 is movable in a state where it holds the mask M. For example, the mask stage 1 is moved by an operation of a driving system 11 which includes a planar motor as disclosed in U.S. Pat. No. 6,452,292. In the present embodiment, the mask stage 1 is able to move in six directions of the X axis, the Y axis, the Z axis, the θX, the θY, and the θZ by the operation of the driving system 11. Moreover, the driving system 11 may not include a planar motor. For example, the driving system 11 may include a linear motor.

The projection optical system PL radiates the exposure light EL to a projection region PR. The projection region PR includes positions which can be irradiated with the exposure light EL emitted from the projection optical system PL. The projection optical system PL projects the image of the pattern of the mask M on at least a portion of the substrate P disposed in the projection region PR by a predetermined projection magnification. In the present embodiment, the projection optical system PL is a reduction system. The projection magnification of the projection optical system PL is ¼. Furthermore, the projection magnification of the projection optical system PL may be ⅕, ⅛, or the like. Moreover, the projection optical system PL may be either an equal magnification system or an enlargement system. In the present embodiment, the optical axis of the projection optical system PL is parallel to the Z axis. The projection optical system PL may be any of a refraction system which does not include a reflective optical element, a reflection system which does not include a refractive optical element, or a reflective refraction system which includes the reflective optical element and the refractive optical element. The projection optical system PL may form either an inverted image or an erected image.

The projection optical system PL includes a terminal optical element 13 which includes an emitting surface 12 from which the exposure light EL is emitted. The terminal optical element 13 is an optical member which constitutes a part of the projection optical system PL. The emitting surface 12 emits the exposure light EL toward the image surface of the projection optical system PL. The terminal optical element 13 is an optical element nearest to the image surface of the projection optical system PL among the plurality of optical elements of the projection optical system PL. The projection region PR includes positions which can be irradiated with the exposure light EL emitted from the emitting surface 12. In the present embodiment, the emitting surface 12 faces the −Z axis direction. The exposure light EL emitted from the emitting surface 12 advances in the −Z axis direction. The emitting surface 12 is parallel to the XY plane. Furthermore, the emitting surface 12 facing the −Z axis direction may have a convex surface or a concave surface. Moreover, the emitting surface 12 may be inclined with respect to the XY plane and include a curved surface. In the present embodiment, the optical axis of the terminal optical element 13 is parallel to the Z axis.

In the present embodiment, with respect to the direction parallel to the optical axis of the terminal optical element 13, the emitting surface 12 side is at the −Z axis side, and the incident surface side is at the +Z axis side. In the present embodiment, with respect to the direction parallel to the optical axis of the projection optical system PL, the image surface side of the projection optical system PL is at the −Z axis side, and the object surface side of the projection optical system PL is at the +Z axis side.

The substrate stage 2 is able to move in the XY plane, which includes positions (projection region PR) which can be irradiated with the exposure light EL from the emitting surface 12, in a state where the substrate stage holds the substrate P. The measurement stage 3 is able to move in the XY plane, which includes positions (projection region PR) which can be irradiated with the exposure light EL from the emitting surface 12, in a state where a measurement member (measuring instrument) C is mounted on the measurement stage. Each of the substrate stage 2 and the measurement stage 3 is able to move on a guide surface 14G of a base member 14. In the present embodiment, the guide surface 14G and the XY plane are substantially parallel to each other.

In the present embodiment, the substrate stage 2 includes a first holding portion which releasably holds the substrate P and a second holding portion which is disposed at surrounding of the first holding portion and releasably holds a cover member T as disclosed in, for example, U.S. Patent Application, Publication No. 2007/0177125, U.S. Patent Application, Publication No. 2008/0049209, and the like. The first holding portion holds the substrate P so that the surface (upper surface) of the substrate P and the XY plane are substantially parallel to each other. In the present embodiment, the upper surface of the substrate P held by the first holding portion and the upper surface of the cover member T held by the second holding portion are disposed at the substantially same plane. Moreover, the upper surface of the substrate P held by the first holding portion and the upper surface of the cover member T held by the second holding portion may not be disposed at the same plane. Furthermore, the upper surface of the cover member T may be inclined with respect to the upper surface of the substrate P, and the upper surface of the cover member T may include a curved surface.

The substrate stage 2 and the measurement stage 3 are moved by an operation of a driving system 15 which includes a planar motor as disclosed in, for example, U.S. Pat. No. 6,452,292. The driving system 15 includes a mover 2C which is disposed at the substrate stage 2, a mover 3C which is disposed at the measurement stage 3, and a stator 14M which is disposed at the base member 14. Each of the substrate stage 2 and the measurement stage 3 is able to move on a guide surface 14G in six directions of the X axis, the Y axis, the Z axis, the θX, the θY, and the θZ directions by the operation of the driving system 15. Moreover, the driving system 15 may not include a planar motor. For example, the driving system 15 may include a linear motor.

The measurement system 4 includes an interferometer system. The interferometer system includes a unit which radiates measurement light to a measurement mirror of the substrate stage 2 and a measurement mirror of the measurement stage 3 and measures the positions of the substrate stage 2 and the measurement stage 3. Moreover, for example, the measurement system may include an encoder system disclosed in U.S. Patent Application, Publication No. 2007/0288121. Furthermore, the measurement system 4 may include only one of the interferometer system and the encoder system.

When exposure processing of the substrate P is performed, or when predetermined measurement processing is performed, the controller 6 performs a position control of the substrate stage 2 (substrate P) and the measurement stage 3 (measurement member C) based on the measurement results of the measurement system 4.

Figure 2:
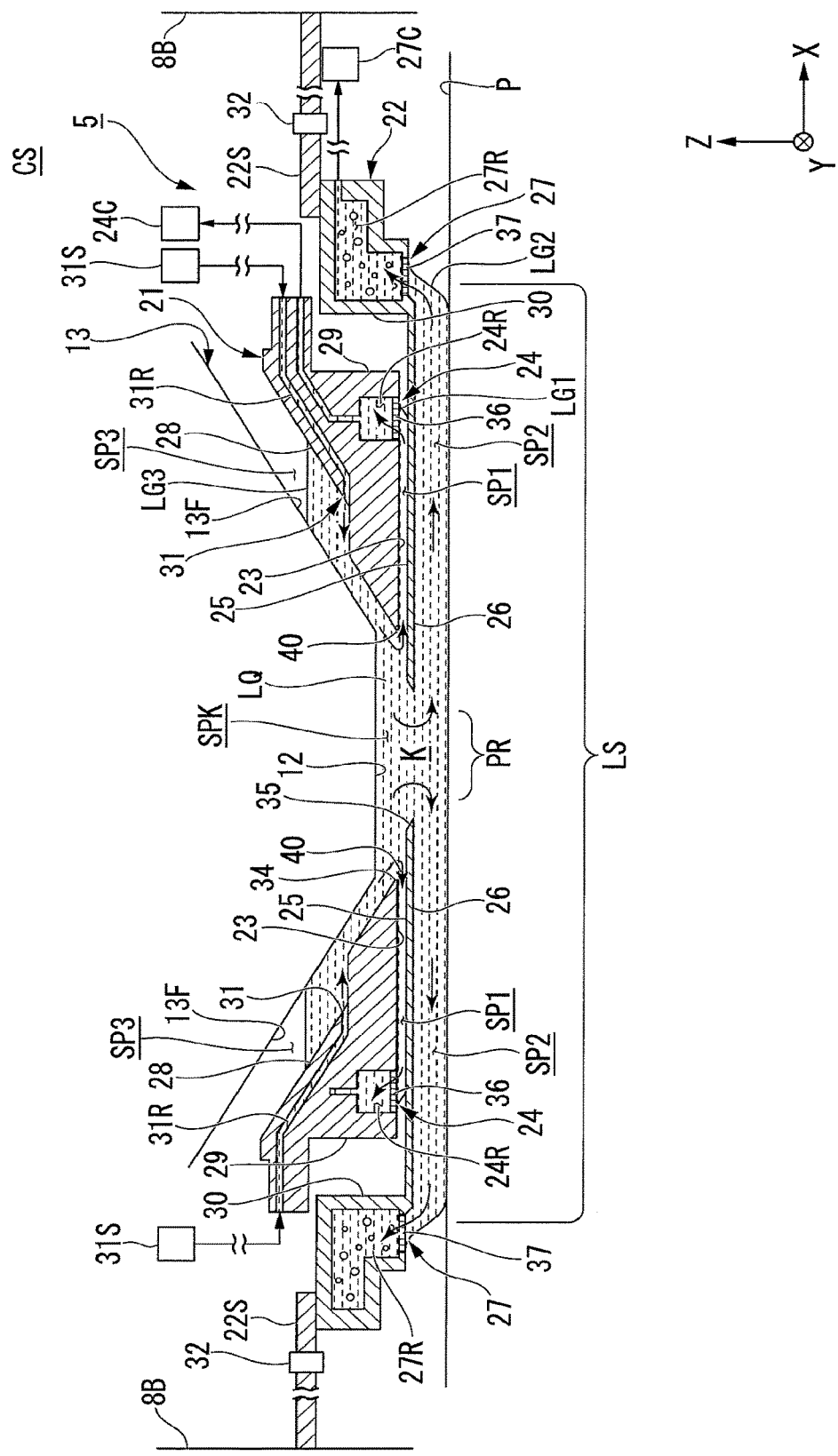
FIG. 2 is a side cross-sectional view showing an example of a liquid immersion member according to the first embodiment.
Figure 3:
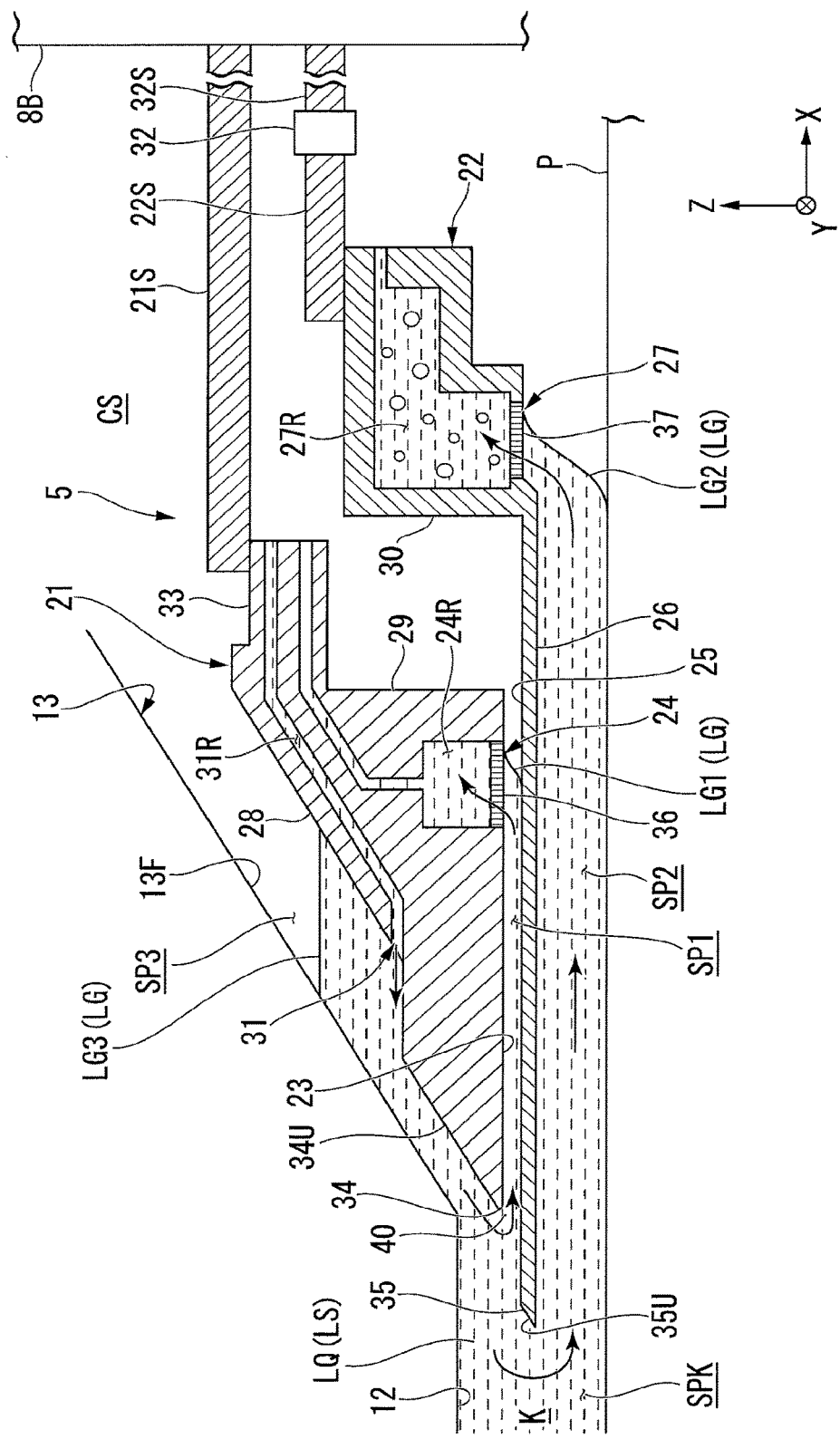
FIG. 3 is a side cross-sectional view showing a portion of the liquid immersion member according to the first embodiment.
Figure 4:
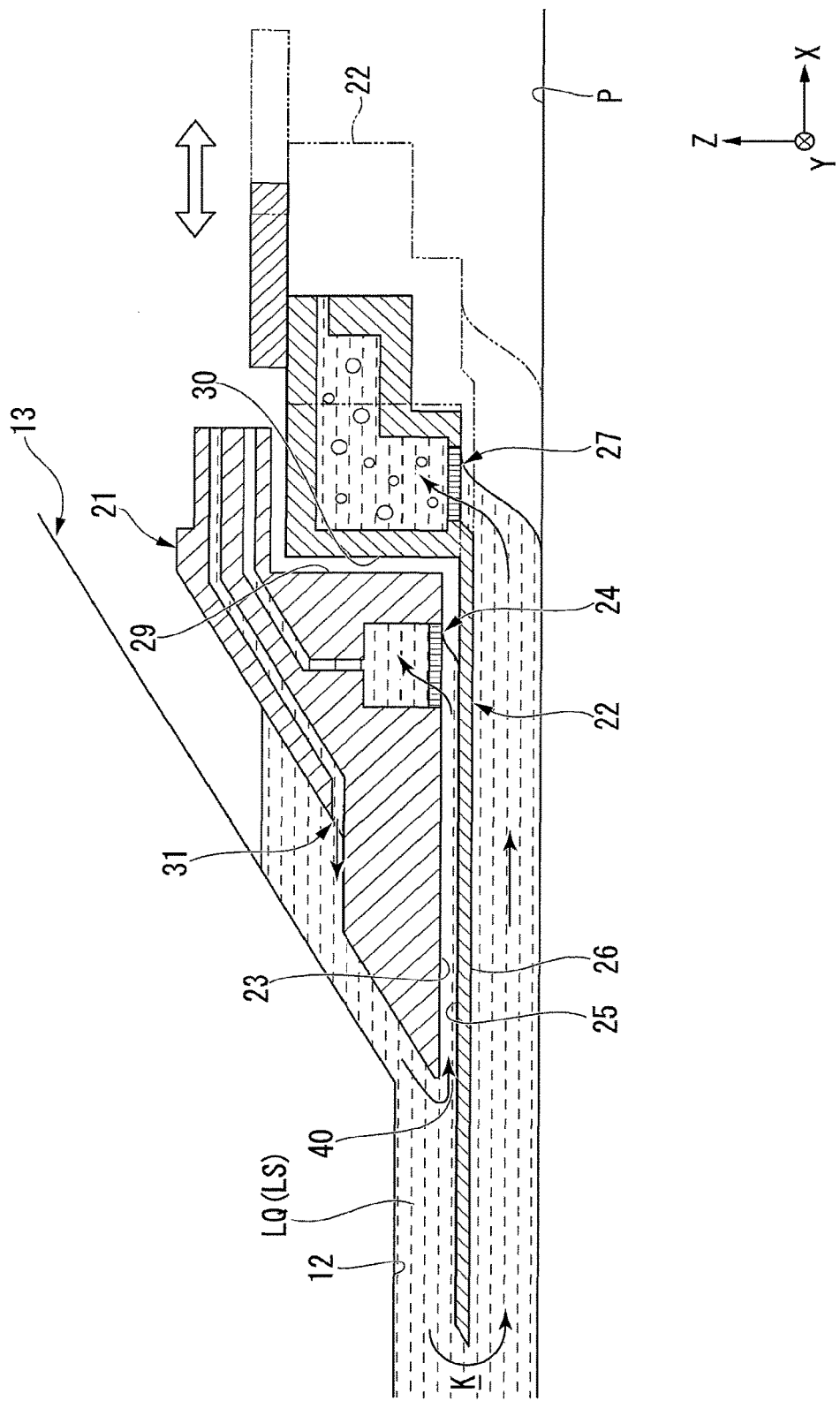
FIG. 4 is a side cross-sectional view showing an example of an operation of the liquid immersion member according to the first embodiment.
Figure 5:
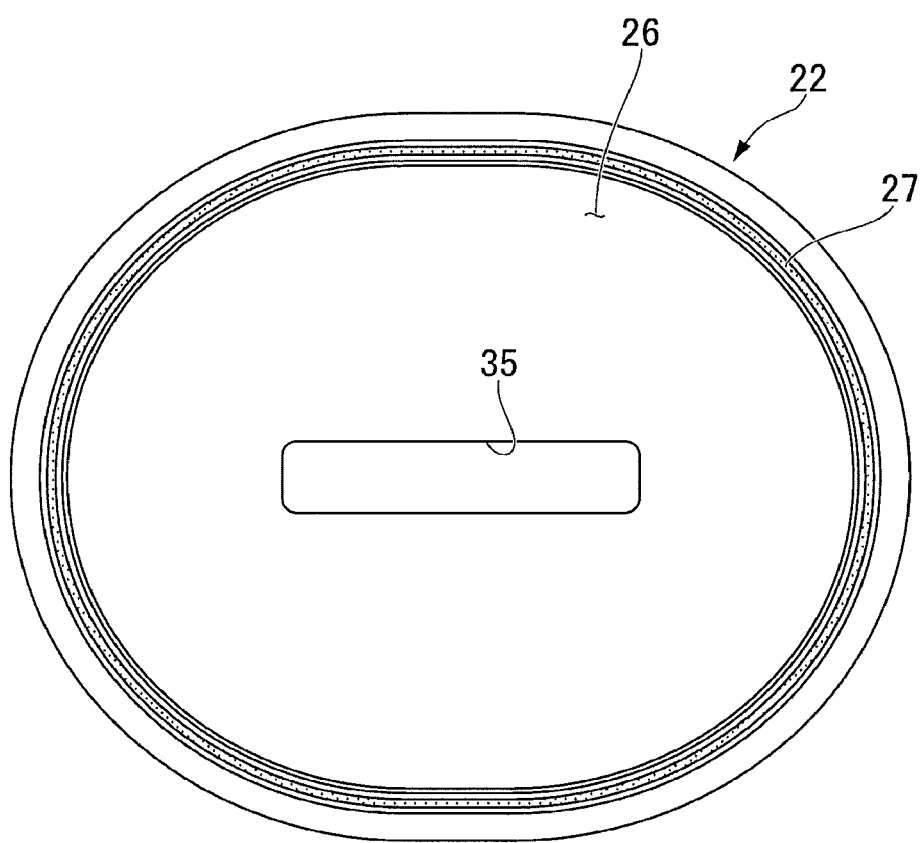
FIG. 5 is a view when the liquid immersion member according to the first embodiment is viewed from below.
Figure 6:
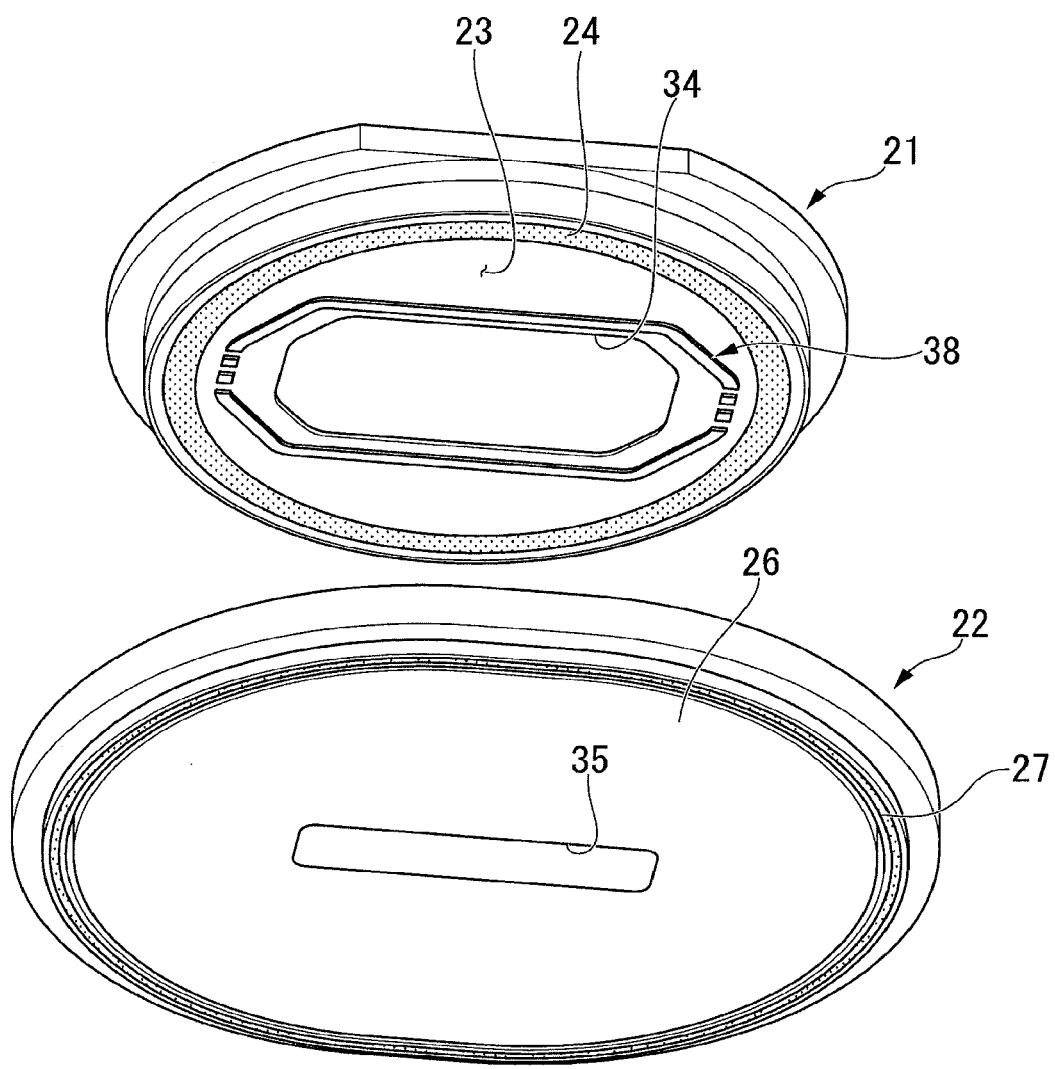
FIG. 6 is an exploded perspective view showing an example of the liquid immersion member according to the first embodiment.
Figure 7:
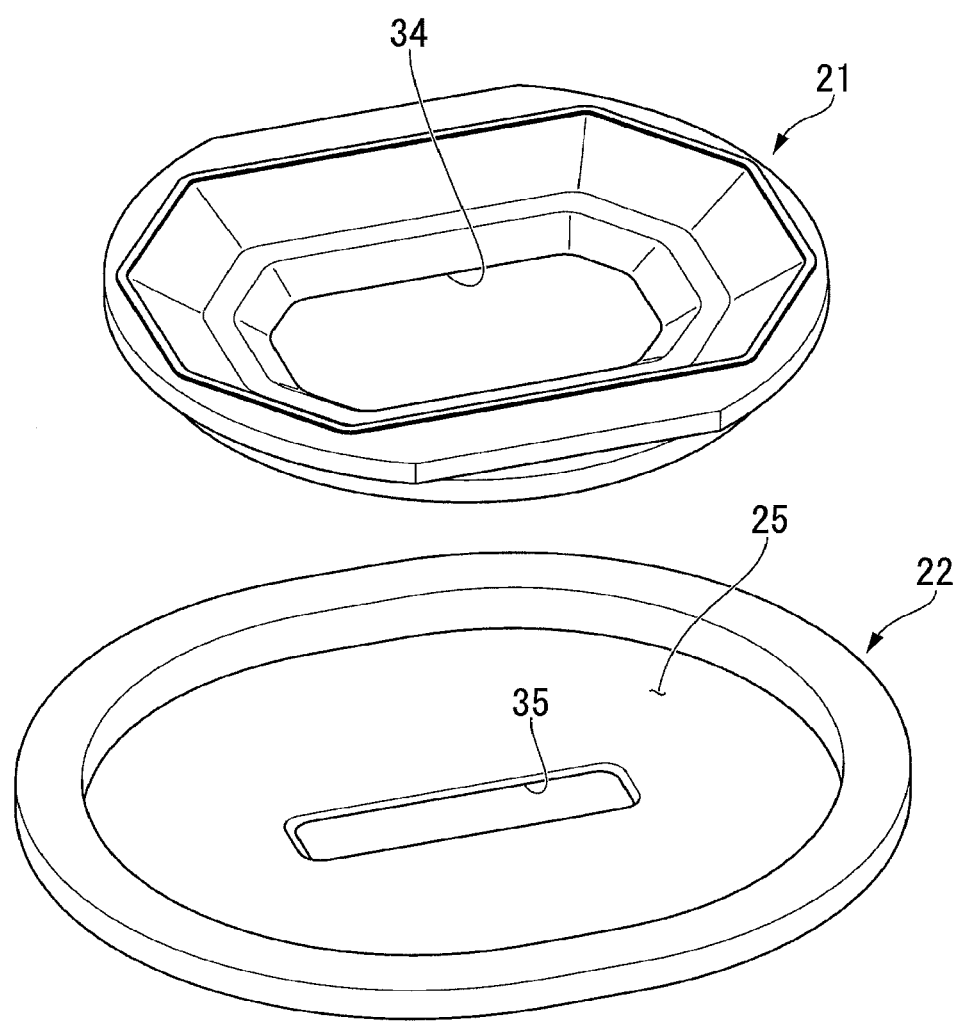
FIG. 7 is an exploded perspective view showing an example of the liquid immersion member according to the first embodiment.

Next, the liquid immersion member 5 according to the present embodiment will be described. In addition, the liquid immersion member may be also referred to as a nozzle member. FIG. 2 is a cross-sectional view parallel to the XZ plane of the liquid immersion member 5. FIG. 3 is a view in which a portion of FIG. 2 is enlarged. FIG. 4 is a view showing an example of the operation of the liquid immersion member 5. FIG. 5 is a view when the liquid immersion member 5 is viewed from below (−Z axis side). FIGS. 6 and 7 are exploded perspective views of the liquid immersion member 5.

The liquid immersion member 5 forms a liquid immersion space LS of the liquid LQ above the object which is movable below the terminal optical element 13.

In the present embodiment, the object which is movable below the terminal optical element 13 is able to move in the XY plane which includes the position facing the emitting surface 12. The object is able to be opposite to the emitting surface 12 and be disposed in the projection region PR. The object is able to move below the liquid immersion member 5 and is able to be opposite to the liquid immersion member 5. In the present embodiment, the object includes at least one of at least a portion of the substrate stage 2 (for example, the cover member T of the substrate stage 2), the substrate P which is held by the substrate stage 2 (first holding portion), and the measurement stage 3. In the exposure of the substrate P, the liquid immersion space LS is formed so that the optical path K of the exposure light EL between the emitting surface 12 of the terminal optical element 13 and the substrate P is filled with the liquid LQ. When the exposure light EL is radiated to the substrate P, the liquid immersion space LS is formed so that only a portion of the surface region of the substrate P which includes the projection region PR is covered by the liquid LQ.

In the descriptions below, the object is the substrate P. Moreover, as described above, the object may be at least one of the substrate stage 2 and the measurement stage 3, and an object may be other than the substrate P, the substrate stage 2, and the measurement stage 3. Moreover, the liquid immersion space LS may be formed so as to be positioned over the cover member T of the substrate stage 2 and the substrate P, and the liquid immersion space LS may be formed so as to be positioned over the substrate stage 2 and the measurement stage 3.

The liquid immersion space LS is formed so that the optical path K of the exposure light EL emitted from the emitting surface 12 of the terminal optical element 13 is filled with the liquid LQ. At least a portion of the liquid immersion space LS is formed in a space between the terminal optical element 13 and the substrate P (object). Moreover, at least a portion of the liquid immersion space LS is formed in a space between the liquid immersion member 5 and the substrate P (object).

The liquid immersion member 5 includes a first member 21 which is disposed at at least a portion of surrounding of the terminal optical element 13, and a second member 22 which is disposed at at least a portion of surrounding of the optical path K below the first member 21 and which is able to relatively move with respect to the first member 21. In the present embodiment, the second member 22 is disposed so as to surround the optical path K at surrounding of the optical path K.

The first member 21 is disposed at a position further away from the substrate P (object) than the second member 22. At least a portion of the second member 22 is disposed between the first member 21 and the substrate P (object).

In the present embodiment, a portion of the second member 22 is disposed below the first member 21. That is, in the present embodiment, a portion of the second member 22 is disposed between the first member 21 and the substrate P (object).

Moreover, at least a portion of the second member 22 is disposed between the terminal optical element 13 and the substrate P (object). Furthermore, the second member 22 may not be disposed between the terminal optical element 13 and the substrate P (object).

The first member 21 includes a low surface 23 facing the −Z axis direction and a liquid recovery part 24 which is disposed at at least a portion of surrounding of the lower surface 23 and which is capable of recovering the liquid LQ. The liquid recovery part 24 may be referred to as a fluid recovery part which is capable of recovering a fluid (one or both of liquid LQ and gas). The second member 22 includes an upper surface 25 facing the +Z axis direction, a lower surface 26 facing the −Z axis direction, and a fluid recovery part 27 which is disposed at at least a portion of surrounding of the lower surface 26. The lower surface 23 may be referred to as a first lower surface. Moreover, the upper surface 25 may be referred to as a second upper surface. Moreover, the lower surface 26 may be referred to as a second lower surface.

The first member 21 includes an inner surface 28 which is opposite to a side surface 13F of the terminal optical element 13, and an outer surface 29 toward the outside with respect to the optical path K (optical axis of the terminal optical element 13). The second member 22 includes an inner surface 30 which is opposite to the outer surface 29 via a gap. The inner surface 28 of the first member 21 may be referred to as an opposite surface.

The inner surface 28 of the first member 21 is opposite to the side surface 13F of the terminal optical element 13 via a gap.

The second member 22 is able to be opposite to the lower surface 23. The second member 22 is able to be opposite to the liquid recovery part 24. In the present embodiment, at least a portion of the upper surface 25 of the second member 22 is opposite to the lower surface 23 via a gap. In the present embodiment, at least a portion of the upper surface 25 is opposite to the emitting surface 12 via a gap. Moreover, the upper surface 25 may not be opposite to the emitting surface 12.

The substrate P (object) is able to be opposite to the lower surface 26. The substrate P (object) is able to be opposite to the fluid recovery part 27. In the present embodiment, at least a portion of the upper surface of the substrate P is opposite to the lower surface 26 via a gap. At least a portion of the upper surface of the substrate P is opposite to the emitting surface 12 via a gap. In the present embodiment, with respect to the Z axis direction, a size of the gap between the upper surface of the substrate P (object) and the lower surface 26 is larger than a size of the gap between the lower surface 23 of the first member 21 and the upper surface 25 of the second member 22. However, the two sizes may be the same as each other. The size of the gap between the upper surface of the substrate P (object) and the lower surface 26 may be smaller than the size of the gap between the lower surface 23 of the first member 21 and the upper surface 25 of the second member 22. In the present embodiment, in the Z axis direction, the size of the gap between the upper surface of the substrate P (object) and the emitting surface 12 may be larger than the gap between the upper surface and the lower surface 26 of the substrate P.

A first space SP1 is formed between the lower surface 23 and the upper surface 25. A second space SP2 is formed between the lower surface 26 and the upper surface of the substrate P (object). A third space SP3 is formed between the side surface 13F and the inner surface 28.

In the present embodiment, the upper surface 25 has liquid repellent property against the liquid LQ. In the present embodiment, the upper surface 25 includes a surface of a resin film which includes fluorine. In the present embodiment, the upper surface 25 include a surface of a PFA (Tetra fluoro ethylene-perfluoro alkylvinyl ether copolymer) film. Moreover, the upper surface 25 may include a surface of PTFE (Poly tetra fluoro ethylene) film. A contact angle of the upper surface 25 with respect to the liquid LQ is larger than 90°. Furthermore, for example, the contact angle of the upper surface 25 with respect to the liquid LQ may be larger than 100°, may be larger than 110°, and may be larger than 120°.

Since the upper surface 25 has liquid repellent property with respect to the liquid LQ, occurrence of a gas portion in the liquid LQ in the first space SP1 or mixing of bubbles into the liquid LQ is suppressed.

Moreover, the contact angle of the upper surface 25 with respect to the liquid LQ may be larger than or be smaller than the contact angle of the upper surface of the substrate P with respect to the liquid LQ. Furthermore, the contact angle of the upper surface 25 with respect to the liquid LQ may be substantially equal to the contact angle of the upper surface of the substrate P with respect to the liquid LQ.

Moreover, the upper surface 25 may have a hydrophilic property with respect to the liquid LQ. The contact angle of the upper surface 25 with respect to the liquid LQ may be smaller than 90°, may be smaller than 80°, and may be smaller than 70°. Accordingly, the liquid LQ smoothly flows in the first space SP1.

Moreover, the lower surface 23 may have liquid repellent property with respect to liquid LQ. For example, both of the lower surface 23 and the upper surface 25 may have liquid repellent property with respect to liquid LQ. Moreover, the lower surface 23 may have liquid repellent property with respect to the liquid LQ, and the upper surface 25 may have hydrophilic property with respect to the liquid LQ.

Furthermore, the lower surface 23 may have hydrophilic property with respect to the liquid LQ. For example, both of the lower surface 23 and the upper surface 25 may have hydrophilic property with respect to liquid LQ. Moreover, the lower surface 23 may have hydrophilic property with respect to the liquid LQ, and the upper surface 25 may have liquid repellent property with respect to the liquid LQ. In the present embodiment, the lower surface 26 has hydrophilic property with respect to the liquid LQ. The contact angle of the lower surface 26 with respect to the liquid LQ may be smaller than 90°, may be smaller than 80°, and may be smaller than 70°. In the present embodiment, the contact angle of the lower surface 26 with respect to the liquid LQ is smaller than the contact angle of the upper surface of the substrate P with respect to the liquid LQ. Furthermore, the contact angle of the lower surface 26 with respect to the liquid LQ may be larger than or be substantially equal to the contact angle of the upper surface of the substrate P with respect to the liquid LQ.

The side surface 13F of the terminal optical element 13 is disposed at surrounding of the emitting surface 12. The side surface 13F is a non-emitting surface from which the exposure light EL is not emitted. The exposure light EL passes through the emitting surface 12 and does not pass through the side surface 13F.

The lower surface 23 of the first member 21 does not recover the liquid LQ. The lower surface 23 is a non-recovery part and is not able to recover the liquid LQ. The lower surface 23 of the first member 21 is able to maintain the liquid LQ between the lower surface and the second member 22.

The upper surface 25 of the second member 22 does not recover the liquid LQ. The upper surface 25 is a non-recovery part and is not able to recover the liquid LQ. The upper surface 25 of the second member 22 is able to maintain the liquid LQ in between with the first member 21.

The lower surface 26 of the second member 22 does not recover the liquid LQ. The lower surface 26 is a non-recovery part and is not able to recover the liquid LQ. The lower surface 26 of the second member 22 is able to maintain the liquid LQ in between with the substrate P (object).

The inner surface 28, the outer surface 29, and the inner surface 30 do not recover the liquid LQ. The inner surface 28, the outer surface 29, and the inner surface 30 are non-recovery parts and are not able to recover the liquid LQ.

In the present embodiment, the lower surface 23 is substantially parallel to the XY plane. The upper surface 25 is also substantially parallel to the XY plane. The lower surface 26 is also substantially parallel to the XY plane. That is, the lower surface 23 and the upper surface 25 are substantially parallel to each other. The upper surface 25 and the lower surface 26 are substantially parallel to each other.

Moreover, the lower surface 23 may be not parallel to the XY plane and include a curved surface. Furthermore, the upper surface 25 may not be parallel to the XY plane and may include a curved surface. Moreover, the lower surface 26 may not be parallel to the XY plane and may include a curved surface. Furthermore, one of the lower surface 23, the upper surface 25, and the lower surface 26 may not be parallel to the other one.

The first member 21 includes an opening 34. The exposure light EL emitted from the emitting surface 12 is able to pass through the opening 34. The second member 22 includes an opening 35. The exposure light EL emitted from the emitting surface 12 is able to pass through the opening 35. The opening 34 may be referred to as a first opening, and the opening 35 may be referred to as a second opening. At least a portion of the terminal optical element 13 is disposed at the inner side of the opening 34. In the present embodiment, at least a portion of an inner surface 34U of the second member 22 is inclined upwardly and outwardly in a radial direction from the optical path K. At least a portion of the inner surface 34U of the second member 22 defines the opening 34 which faces the optical path K. The lower surface 23 is arranged at surrounding of the lower end of the opening 34. The upper surface 25 is arranged at surrounding of the upper end of the opening 35. The lower surface 26 is arranged at surrounding of the lower end of the opening 35.

In the present embodiment, at least a portion of the inner surface 35U of the second member 22 is inclined upwardly and outwardly in a radial direction from the optical path K. At least a portion of the inner surface 35U of the second member 22 defines the opening 35 which faces the optical path K. Accordingly, the second member 22 is able to smoothly move in a state where the inner surface 35U of the second member 22 is arranged at the liquid immersion space LS. Moreover, even when the second member 22 moves in a state where the inner surface 35U of the second member 22 is arranged at the liquid immersion space LS, a change in a pressure of the liquid LQ in the liquid immersion space LS is suppressed.

In the present embodiment, the size of the opening 34 in the XY plane is larger than the size of the opening 35. In the present embodiment, with respect to the X axis direction, the size of the opening 34 is larger than the size of the opening 35. In the present embodiment, with respect to the Y axis direction, the size of the opening 34 is larger than the size of the opening 35. In the present embodiment, the first member 21 is not disposed immediately below the emitting surface 12, and the opening 34 is disposed at surrounding of the emitting surface 12. In the present embodiment, the opening 34 is larger than the emitting surface 12. In the present embodiment, the lower end of the gap which is formed between the side surface 13F of the terminal optical element 13 and the first member 21 faces the upper surface 25 of the second member 22. Moreover, the opening 35 of the second member 22 is disposed to be opposite to the emitting surface 12. In the present embodiment, the shape of the opening 35 in the XY plane is a rectangular shape which is long in the X axis direction. Moreover, the shape of the opening 35 is not limited to the rectangular shape, and may be an elliptical shape which is long in the X axis direction and a polygonal shape which is long in the X axis direction.

Furthermore, the size of the opening 34 may be smaller than the size of the opening 35. Moreover, the size of the opening 34 may be substantially the same as the size of the opening 35. Furthermore, with respect to the X axis direction, the size of the opening 34 may be smaller than the size of the opening 35, and with respect to the Y axis direction, the size of the opening 34 may be larger than the size of the opening 35.

The first member 21 is disposed at a surrounding of the terminal optical element 13. The first member 21 is an annular member. The first member 21 is disposed so as not to contact the terminal optical element 13. A gap is formed between the first member 21 and the terminal optical element 13. In the present embodiment, the first member 21 is not opposite to the emitting surface 12. Furthermore, a portion of the first member 21 may not be opposite to the emitting surface 12. That is, a portion of the first member 21 may be disposed between the emitting surface 12 and the upper surface of the substrate P (object). Moreover, the first member 21 may not be annular. For example, the first member 21 may be disposed at a portion of surrounding of the terminal optical element 13 (optical path K). For example, a plurality of first members 21 may be disposed at surrounding of the terminal optical element 13 (optical path K).

The second member 22 is disposed at a surrounding of the optical path K. The second member 22 is an annular member. The second member 22 is disposed so as not to contact the first member 21. A gap is formed between the second member 22 and the first member 21.

In the present embodiment, the first member 21 is supported by the apparatus frame 8B via a support member 21S. In addition, the first member 21 may be supported by the reference frame 8A via the support member.

The second member 22 is supported by the apparatus frame 8B via the support member 22S. The support member 22S is connected to the second member 22 outside the first member 21 with respect to the optical path K. Moreover, the first member 21 may be supported by the reference frame 8A via the support member.

The second member 22 is able to relatively move with respect to the first member 21. The second member 22 is able to relatively move with respect to the terminal optical element 13. A relative position between the second member 22 and the first member 21 is changed. The relative position between the second member 22 and the terminal optical element 13 is changed.

The second member 22 is able to relatively move in the XY plane perpendicular to the optical axis of the terminal optical element 13. The second member 22 is able to move to be substantially parallel to the XY plane. As shown in FIG. 4, in the present embodiment, the second member 22 is able to move in at least the X axis direction. Moreover, the second member 22 is able to move in at least one direction of the Y axis, the Z axis, the θX, the θY, and the θZ directions, in addition to the X axis direction.

In the present embodiment, the terminal optical element 13 does not substantially move. The first member 21 also does not substantially move.

The second member 22 is able to move below at least a portion of the first member 21. The second member 22 is able to move between the first member 21 and the substrate P (object).

In the present embodiment, the second member 22 moves in the XY plane, and thus, the size of the gap between the outer surface 29 of the first member 21 and the inner surface 30 of the second member 22 is changed. In other words, the second member 22 moves in the XY plane, and thus, the size of the space between the outer surface 29 and the inner surface 30 is changed. For example, in the example shown in FIG. 4, the second member 22 moves in the −X axis direction, and thus, the size of the gap between the outer surface 29 and the inner surface 30 is decreased (the space between the outer surface 29 and the inner surface 30 is decreased). The second member 22 moves in the +X axis direction, and thus, the size of the gap between the outer surface 29 and the inner surface 30 is increased (the space between the outer surface 29 and the inner surface 30 is increased). In the present embodiment, a movable range of the second member 22 is determined so that the first member 21 (outer surface 29) and the second member 22 (inner surface 30) do not contact each other.

In the present embodiment, the second member 22 is moved by a driving apparatus 32. In the present embodiment, the driving apparatus 32 moves the support member 22S. The second member 22 is movable according to a movement of the support member 22S moved by a driving apparatus 32. For example, the driving apparatus 32 includes a motor and moves the second member 22 using the Lorentz force.

The driving apparatus 32 is supported by the apparatus frame 8B via the support member 32S. In the present embodiment, the second member 22 is supported by the apparatus frame 8B via the support member 22S, the driving apparatus 32, and the support member 32S. Even when vibration occurs due to the movement of the second member 22, transmission of the vibration to the reference frame 8A is suppressed by the vibration isolator 10.

For example, the second member 22 may move in parallel with at least a part of a period in which the exposure light EL is emitted from the emitting surface 12. The second member 22 may move in parallel with at least a part of a period in which the exposure light EL is emitted from the emitting surface 12 in a state where the liquid immersion space LS is formed.

The second member 22 may move in parallel with at least a part of a period in which the substrate P (object) moves. The second member 22 may move in parallel with at least a part of a period in which the substrate P (object) moves in the state where the liquid immersion space LS is formed.

The second member 22 may move in the movement direction of the substrate P (object). For example, when the substrate P moves in one direction (for example, +X axis direction) in the XY plane, the second member 22 may move in one direction (the +X axis direction) in the XY plane in parallel with the movement of the substrate P.

The liquid immersion member 5 includes a liquid supply part 31 which supplies the liquid LQ to form the liquid immersion space LS. In the present embodiment, the liquid supply part 31 is disposed at the first member 21. Moreover, the liquid supply part 31 may be disposed at both of the first member 21 and the second member 22. Moreover, the liquid supply part 31 may be disposed at the first member 21 and not be disposed at the second member 22. Furthermore, the liquid supply part 31 may be disposed at the second member 22 and not be disposed at the first member 21. Moreover, the liquid supply part 31 may be disposed at members other than the first member 21 and the second member 22.

The liquid supply part 31 is disposed inside the liquid recovery part 24 and the fluid recovery part 27 in the radial direction from the optical path K (the optical axis of the terminal optical element 13). In the present embodiment, the liquid supply part 31 includes an opening (liquid supply port) which is disposed at the inner surface 28 of the first member 21. The liquid supply part 31 is disposed to be opposite to the side surface 13F. The liquid supply part 31 supplies the liquid LQ to the third space SP3 between the side surface 13F and the inner surface 28. In the present embodiment, the liquid supply part 31 is disposed at each of the +X axis side and the −X axis side with respect to the optical path K (terminal optical element 13). Moreover, the liquid supply part 31 may be disposed at the Y axis direction with respect to the optical path K (terminal optical element 13), and the plurality of liquid supply parts may be disposed at a surrounding of the optical path K (terminal optical element 13) which includes the X axis direction and the Y axis direction. Moreover, the liquid supply part 31 may be one. Furthermore, instead of the liquid supply part 31 or in addition to the liquid supply part 31, a liquid supply part which is able to supply the liquid LQ may be provided at the lower surface 23.

In the present embodiment, the liquid supply part (liquid supply port) 31 is connected to a liquid supply apparatus 31S via a supply channel 31R which is formed in the inner portion of the first member 21. The liquid supply apparatus 31S is able to supply the cleaned liquid LQ, in which the temperature is adjusted, to the liquid supply part 31. In order to form the liquid immersion space LS, the liquid supply part 31 supplies the liquid LQ from the liquid supply apparatus 31S.

An opening 40 is formed between the inner edge of the lower surface 23 and the upper surface 25. An optical path space SPK which includes the optical path K between the emitting surface 12 and the substrate P (object) and the first space SP1 between the lower surface 23 and the upper surface 25 are connected to each other via the opening 40. The optical path space SPK includes the space between the emitting surface 12 and the substrate P (object) and the space between the emitting surface 12 and the upper surface 25. The opening 40 is disposed so as to face the optical path K. The third space SP3 between the side surface 13F and the inner surface 28 and the first space SP1 are connected to each other via the opening 40.

At least a portion of the liquid LQ from the liquid supply part 31 is supplied to the first space SP1 between the lower surface 23 and the upper surface 25 via the opening 40. At least a portion of the liquid LQ, which is supplied from the liquid supply part 31 to form the liquid immersion space LS, is supplied to the substrate P (object) opposite to the emitting surface 12 via the opening 34 and the opening 35. Accordingly, the optical path K is filled with the liquid LQ. At least a portion of the liquid LQ from the liquid supply part 31 is supplied to the second space SP2 between the lower surface 26 and the upper surface of the substrate P (object).

In the present embodiment, with respect to the Z axis direction, the size of the first space SP1 is smaller than the size of the second space SP2. In addition, with respect to the Z axis direction, the size of the first space SP1 may be substantially the same as the size of the second space SP2 and larger than the size of the second space SP2.

The liquid recovery part 24 is disposed outside the lower surface 23 with respect to the optical path K (with respect to an optical axis of the terminal optical element 13).

In the present embodiment, the liquid recovery part 24 is disposed at surrounding of the lower surface 23. The liquid recovery part 24 is disposed at surrounding of the optical path K of the exposure light EL. Moreover, the liquid recovery part 24 may be disposed at a portion of a surrounding of the lower surface 23. For example, a plurality of the liquid recovery parts 24 may be disposed at a surrounding of the lower surface 23. In the present embodiment, the liquid recovery part 24 recovers at least a portion of the liquid LQ in the first space SP1.

A fluid recovery part 27 is disposed outside the lower surface 26 with respect to the optical path K (with respect to an optical axis of the terminal optical element 13). In the present embodiment, the fluid recovery part 27 is disposed at surrounding of the lower surface 26. The fluid recovery part 27 is disposed at surrounding of the optical path K of the exposure light EL. Moreover, the fluid recovery part 27 may be disposed at a portion of a surrounding of the lower surface 26. For example, a plurality of the fluid recovery parts 27 may be disposed at a surrounding of the lower surface 26. In the present embodiment, the fluid recovery part 27 is disposed to face the substrate P (object). The fluid recovery part 27 recovers at least a portion of the liquid LQ in the second space SP2.

In the present embodiment, the fluid recovery part 27 is disposed outside the outer surface 29 of the first member 21 with respect to the optical path K (the optical axis of the terminal optical element 13). Moreover, the fluid recovery part 27 is disposed outside the first space SP1 with respect to the optical path K (the optical axis of the terminal optical element 13). Furthermore, the fluid recovery part 27 is disposed outside the upper surface 25 with respect to the optical path K (the optical axis of the terminal optical element 13).

In the present embodiment, movement of the liquid LQ from one of the first space SP1 at the upper surface 25 side and the second space SP2 at the lower surface 26 side to the other is suppressed. The first space SP1 and the second space SP2 are partitioned by the second member 22. The liquid LQ in the first space SP1 is able to move to the second space SP2 via the opening 35. The liquid LQ in the first space SP1 is able to move to the second space SP2 only through the opening 35. The liquid LQ, which is present in the first space SP1 outside than the opening 35 from the optical path K, is not able to move to the second space SP2. The liquid LQ in the second space SP2 is able to move to the first space SP1 via the opening 35. The liquid LQ in the second space SP2 is able to move to the first space SP1 only through the opening 35. The liquid LQ, which is present in the second space SP2 outside than the opening 35 from the optical path K, is not able to move to the first space SP1. That is, in the present embodiment, the liquid immersion member 5 does not have a channel which fluidly connects the first space SP1 and the second space SP2, other than the opening 35.

In the present embodiment, the fluid recovery part 27 recovers at least a portion of the liquid LQ in the second space SP2 and does not recover the liquid LQ in the first space SP1. The liquid recovery part 24 recovers at least a portion of the liquid LQ in the first space SP1 and does not recover the liquid LQ in the second space SP2. In a case where the upper surface 25 of the second member 22 is not present below the liquid recovery part 24, the liquid recovery part 24 may recover the liquid LQ on the object (substrate P).

Moreover, the liquid LQ, which moved outside (outside of the outer surface 29) of the first space SP1 from the optical path K, is suppressed from being moved to the substrate P (second space SP2) due to the inner surface 30.

The liquid recovery part 24 includes an opening (liquid recovery port) which is disposed at at least a portion of surrounding of the lower surface 23 of the first member 21. The liquid recovery part 24 is disposed to be opposite to the upper surface 25. The liquid recovery part 24 is connected to a liquid recovery apparatus 24C via a recovery channel (space) 24R which is formed in the inner portion of the first member 21. The liquid recovery apparatus 24C is able to connect the liquid recovery part 24 and a vacuum system (not shown). The liquid recovery part 24 is able to recover at least a portion of the liquid LQ in the first space SP1. At least a portion of the liquid LQ in the first space SP1 is able to flow into the recovery channel 24R via the liquid recovery part 24. The liquid recovery part 24 may recover the liquid LQ which flows from the third space SP3 between the side surface 13F of the terminal optical element 13 and the inner surface of the first member 21 through to the upper surface of the first member 21 and then flows above the upper surface 25 of the second member 22 via the space between the outer surface 29 of the first member 21 and the inner surface 30 of the second member 22. That is, the liquid recovery part 24 may be used as a recovery part that recovers the liquid LQ which flows from the third space SP3 through to the above of the upper surface 25 of the second member 22 without passing through the opening 40. Naturally, the recovery part that recovers the liquid LQ from the third space SP3 may be disposed at the upper surface of the first member 21, or may be disposed at at least one of the upper surface 25 of the second member 22 and the inner surface 30.

In the present embodiment, the liquid recovery part 24 includes a porous member 36. In the present embodiment, the liquid recovery port includes holes of the porous member 36. In the present embodiment, the porous member 36 includes a mesh plate. The porous member 36 includes a lower surface to which the upper surface 25 is able to be opposite, an upper surface which faces the recovery channel 24R, and the plurality of holes which connect the lower surface and the upper surface. The liquid recovery part 24 recovers the liquid LQ via the holes of the porous member 36. The liquid LQ recovered from the liquid recovery part 24 (holes of the porous member 36) flows into the recovery channel 24R, flows the recovery channel 24R, and is recovered by the liquid recovery apparatus 24C.

In the present embodiment, substantially only the liquid LQ is recovered via the liquid recovery part 24, and the recovery of gas via the liquid recovery part 24 is limited. A controller 6 adjusts a pressure difference between pressure (pressure of the first space SP1) at the lower surface side of the porous member 36 and pressure (pressure of the recovery channel 24R) at the upper surface side of the porous member 36 so that the liquid LQ in the first space SP1 passes through the holes of the porous member 36 and flows into the recovery channel 24R and gas does not pass through the holes of the porous member 36. Moreover, for example, an example of technology which recovers only liquid via the porous member is disclosed in U.S. Pat. No. 7,292,313 or the like.

Furthermore, both of the liquid LQ and the gas may be recovered (sucked) via the porous member 36. That is, the liquid recovery part 24 may recover the liquid LQ along with gas. Additionally, the liquid recovery part 24 may only recover gas when the liquid LQ is not present below the liquid recovery part 24. Moreover, the porous member 36 may not be provided.

In the present embodiment, the lower surface of the liquid recovery part 24 includes the lower surface of the porous member 36. The lower surface of the liquid recovery part 24 is disposed at surrounding of the lower surface 23. In the present embodiment, the lower surface of the liquid recovery part 24 is substantially parallel with the XY plane. In the present embodiment, the lower surface of the liquid recovery part 24 and the lower surface 23 are disposed in the same plane (flush with each other).

Moreover, the lower surface of the liquid recovery part 24 may be disposed at more +Z axis side than the lower surface 23 and may be disposed at more −Z axis side than the lower surface 23. Furthermore, the lower surface of the liquid recovery part 24 may be inclined with respect to the lower surface 23 and may include a curved surface.

Moreover, the liquid recovery part 24 for recovering the fluid (one or both of the liquid LQ and the gas) of the first space SP1 may be disposed at the second member 22. For example, the liquid recovery part 24 may be provided at the periphery of the upper surface 25. The liquid recovery part 24 may be disposed at both of the first member 21 and the second member 22. The liquid recovery part 24 may be disposed at the first member 21 and not be disposed at the second member 22. The liquid recovery part 24 may be disposed at the second member 22 and may not be disposed at the first member 21.

The fluid recovery part 27 includes an opening (fluid recovery port) which is disposed at at least a portion of surrounding of the lower surface 26 of the second member 22. The fluid recovery part 27 is disposed to be opposite to the upper surface of the substrate P (object). The fluid recovery part 27 is connected to a fluid recovery apparatus 27C via a recovery channel (space) 27R which is formed in the inner portion of the second member 22. The fluid recovery apparatus 27C is able to connect the fluid recovery part 27 and a vacuum system (not shown). The fluid recovery part 27 is able to recover at least a portion of the liquid LQ at the second space SP2. At least a portion of the liquid LQ at the second space SP2 is able to flow into the recovery channel 27R via the fluid recovery part 27.

In the present embodiment, the fluid recovery part 27 includes a porous member 37, and the fluid recovery port includes holes of the porous member 37. In the present embodiment, the porous member 37 includes a mesh plate. The porous member 37 includes a lower surface to which the upper surface of the substrate P (object) is able to be opposite, an upper surface which faces the recovery channel 27R, and the plurality of holes which connect the lower surface and the upper surface. The fluid recovery part 27 recovers the fluid (one or both of the liquid LQ and the gas) via the holes of the porous member 37. The liquid LQ recovered from the fluid recovery part 27 (holes of the porous member 37) flows into the recovery channel 27R, flows the recovery channel 27R, and is recovered by the fluid recovery apparatus 27C.

In the present embodiment, the recovery channel 27R is disposed outside the inner surface 30 with respect to the optical path K (the optical axis of the terminal optical element 13). The recovery channel 27R is disposed above the fluid recovery part 27. The second member 22 moves, and thus, the fluid recovery part 27 and the recovery channel 27R of the second member 22 moves outside the outer surface 29 of the first member 21.

In the present embodiment, the gas is recovered via the fluid recovery part 27 along with the liquid LQ. Moreover, only the liquid LQ is recovered via the porous member 37, and the recovery of the gas via the porous member 37 may be limited. Furthermore, the porous member 37 may not be provided.

In the present embodiment, the lower surface of the fluid recovery part 27 includes the lower surface of the porous member 37. The lower surface of the fluid recovery part 27 is disposed at surrounding of the lower surface 26. In the present embodiment, the lower surface of the fluid recovery part 27 is substantially parallel with the XY plane. In the present embodiment, the lower surface of the fluid recovery part 27 may be disposed at more +Z axis side than the lower surface 26.

Figure 25:
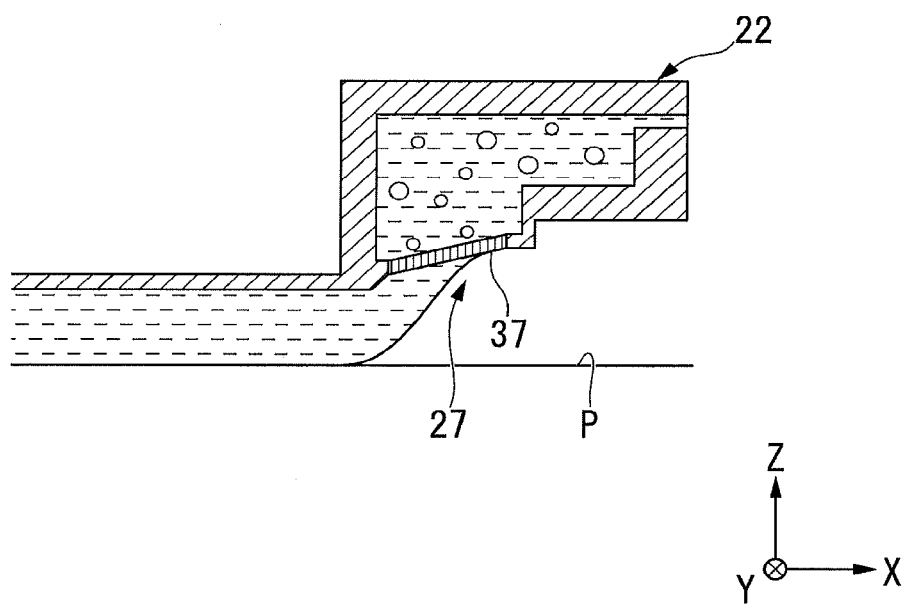
FIG. 25 is a view showing an example of a second member.

Moreover, the lower surface of the fluid recovery part 27 and the lower surface 26 may be disposed in the same plane (may be flush with each other). The lower surface of the fluid recovery part 27 may be disposed at more −Z axis side than the lower surface 26. Furthermore, the lower surface of the fluid recovery part 27 may be inclined with respect to the lower surface 26 and may include a curved surface. For example, as shown in FIG. 25, the lower surface of the fluid recovery part 27 (porous member 37) may be inclined upwardly and outwardly in a radial direction from the optical path K. The height of the lower surface of the fluid recovery part 27 (porous member 37) may not have substantially same height in the whole circumferences of the surrounding of the opening 35. For example, portions of the lower surface of the fluid recovery part 27 (porous member 37) that locates at both sides of the opening 35 in the Y axis direction may be located lower than portions of the lower surface of the fluid recovery part 27 (porous member 37) that locates at both sides of the opening 35 in the X axis direction.

For example, when the lower surface of the fluid recovery part 27 (porous member 37) of the second member 22 opposites the surface of the substrate P, the form of the lower surface of the fluid recovery part 27 (porous member 37) may be determined such that a size (a distance in Z axis direction) of a gap, which is formed at one side of the Y axis direction with respect to the optical path K of the exposure light and which is formed between the lower surface of the fluid recovery part 27 (porous member 37) and the surface of the substrate P, becomes smaller than a size (a distance in Z axis direction) of a gap, which is formed at one side of the X axis direction with respect to the optical path K and which is formed between the lower surface of the fluid recovery part 27 (porous member 37) and the surface of the substrate P.

In the present embodiment, since the recovery operation of the liquid LQ from the fluid recovery part 27 is performed in parallel with the supply operation of the liquid LQ from the liquid supply part 31, the liquid immersion space LS is formed between the terminal optical element 13 and the liquid immersion member 5 at one side and the substrate P (object) at the another side, by the liquid LQ.

Moreover, in the present embodiment, the recovery operation of the liquid from the liquid recovery part 24 is performed in parallel with the supply operation of the liquid LQ from the liquid supply part 31 and the recovery operation of the fluid from the fluid recovery part 27.

In the present embodiment, a portion of an interface LG of the liquid LQ in the liquid immersion space LS is formed between the second member 22 and the substrate P (object).

Moreover, in the present embodiment, a portion of the interface LG of the liquid LQ in the liquid immersion space LS is formed between the first member 21 and the second member 22.

Furthermore, in the present embodiment, a portion of the interface LG of the liquid LQ in the liquid immersion space LS is formed between the terminal optical element 13 and the first member 21.

In the descriptions below, the interface LG of the liquid LQ which is formed between the first member 21 and the second member 22 is appropriately referred to as a first interface LG1. The interface LG which is formed between the second member 22 and the substrate P (object) is appropriately referred to as a second interface LG2. The interface LG which is formed between the terminal optical element 13 and the first member 21 is appropriately referred to as a third interface LG3.

In the present embodiment, the first interface LG1 is formed between the lower surface of the liquid recovery part 24 and the upper surface 25. The second interface LG2 is formed between the lower surface of the fluid recovery part 27 and the upper surface of the substrate P (object).

In the present embodiment, the first interface LG1 is formed between the lower surface of the liquid recovery part 24 and the upper surface 25, and the movement of the liquid LQ in the first space SP1 to the space (for example, the space between the outer surface 29 and the inner surface 30) outside the liquid recovery part 24 is suppressed. The liquid LQ is not present in the space between the outer surface 29 and the inner surface 30, and the space between the outer surface 29 and the inner surface 30 becomes a space with gas. Moreover, the space between the outer space 29 and the inner space 30 is connected to the space CS. In other words, the space between the outer surface 29 and the inner surface 30 is opened to the atmosphere. When the pressure of the space CS is atmospheric pressure, the space between the outer surface 29 and the inner space 30 is opened to the atmosphere. Accordingly, the second member 22 is able to smoothly move. Moreover, the pressure of the space CS may be higher or lower than the atmospheric pressure.

Figure 8:
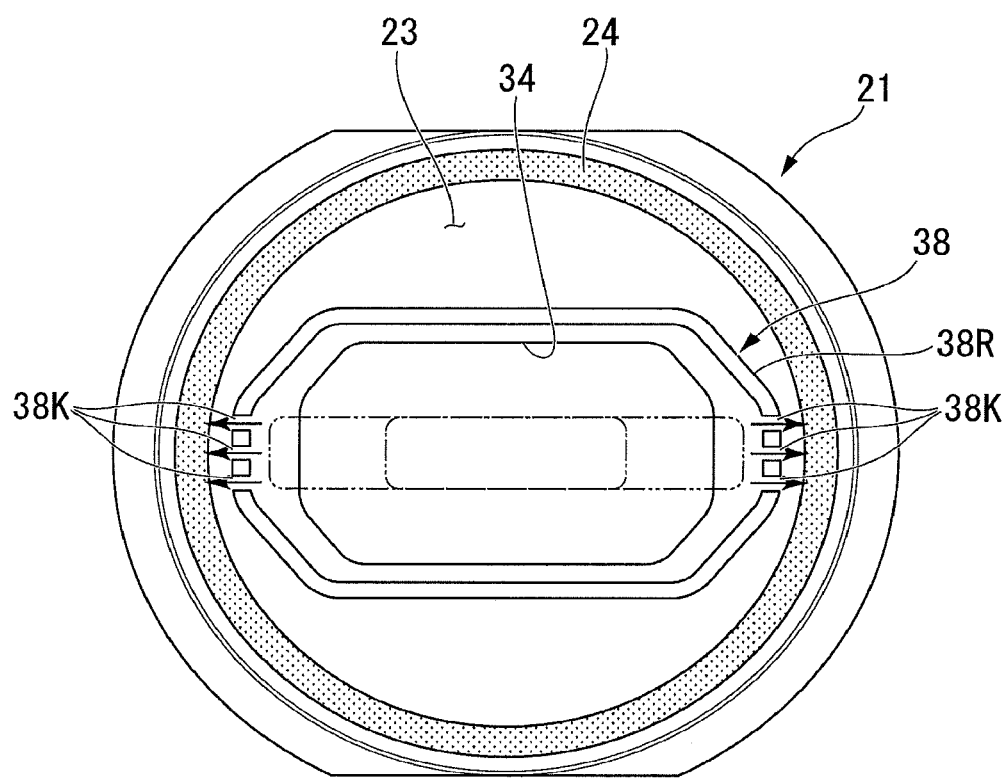
FIG. 8 is a view showing an example of a first member according to the first embodiment.

FIG. 8 is a view when the first member 21 is viewed from the lower surface 23 side. In the present embodiment, an introducing part 38, which introduces at least a portion of the liquid LQ from the liquid supply part 31, is disposed at the lower surface 23 of the first member 21. The introducing part 38 is a protruding part which is provided at the lower surface 23. In the present embodiment, the introducing part 38 introduces at least a portion of the liquid LQ from the liquid supply part 31 to the liquid recovery part 24. Moreover, the introducing part 38 may not be provided at the lower surface 23.

In the present embodiment, the shape of the introducing part 38 is determined based on the movement direction of the second member 22. In the present embodiment, the introducing part 38 is provided to promote the flow of the liquid LQ in the direction parallel to the movement direction of the second member 22.

For example, when the second member 22 moves in the X axis direction, the shape of the introducing part 38 is determined so that the liquid LQ flows in the direction parallel to the X axis direction in the first space SP1 and reaches the liquid recovery part 24. For example, when the second member 22 moves in the +X axis direction, at least a portion of the liquid LQ in the first space SP1 flows in the +X axis direction by the introducing part 38. When the second member 22 moves in the −X axis direction, at least a portion of the liquid LQ in the first space SP1 flows in the −X axis direction by the introducing part 38.

In the present embodiment, the introducing part 38 includes a circumferential wall part 38R which is disposed to surround the opening 34 and a slit (opening) 38K which is formed at a portion of the circumferential wall portion 38R. The slit 38K is formed at each of the +X axis side and the −X axis side with respect to the optical path K so that the flow of the liquid LQ in the direction parallel to the X axis direction is promoted.

Due to the introducing part 38, a flow rate of the liquid LQ in the first space SP1 is able to be increased with respect to the direction parallel to the movement direction of the second member 22. In the present embodiment, due to the introducing part 38, the flow rate of the liquid LQ is increased with respect to the X axis direction in the first space SP1. That is, velocity of the liquid LQ, which flows toward the space between the lower surface of the liquid recovery part 24 and the upper surface 25, is increased. Accordingly, the change of the position of the first interface LG1 with respect to the first member 21 or the change of the shape of the first interface LG1 is suppressed. Therefore, the liquid LQ in the first space SP1 is suppressed from being flowed outside the first space SP1.

Moreover, the position at which the slit 38K is formed is not limited to the +X axis side and the −X axis side with respect to the optical path K. For example, when the second member 22 moves parallel with the Y axis, the slit 38K may be added to the +Y axis side and the −Y axis side with respect to the optical path K. Alternatively, when the second member 22 does not move parallel with the Y axis, the slit 38K may be added to the +Y axis side and the −Y axis side with respect to the optical path K.

Furthermore, the shape (position or the like of the slit 38K) of the introducing part 38 may not be determined based on the movement direction of the second member 22. For example, the shape of the introducing part 38 may be determined so that the liquid LQ radially flows with respect to the optical path K in the entire circumference of the optical path K.

In the present embodiment, the second member 22 is able to be opposite to the entire lower surface 23. For example, as shown in FIG. 2, when the second member 22 is disposed at an origin where the optical axis of the terminal optical element 13 and the center of the opening 35 substantially coincide with each other, the entire lower surface 23 is opposite to the upper surface 25 of the second member 22. Furthermore, when the second member 22 is disposed at the origin, a portion of the emitting surface 12 is opposite to the upper surface 25 of the second member 22. Moreover, when the second member 22 is disposed at the origin, the lower surface of the liquid recovery part 24 is opposite to the upper surface 25 of the second member 22.

Furthermore, in the present embodiment, when the second member 22 is disposed at the origin, the center of the opening 34 substantially coincides with the center of the opening 35.

Next, an example of the operation of the second member 22 will be described. The second member 22 is able to move in cooperation with the movement of the substrate P (object). The second member 22 is able to move to be independent of the substrate P (object). That is, the second member 22 is able to move in a direction different from the substrate P (object) and is able to move at a speed different from the substrate P (object). The second member 22 is able to move in parallel with at least a portion of the movement of the substrate P (object). The second member 22 is able to move in a state where the liquid immersion space LS is formed. The second member 22 is able to move in a state where the liquid LQ is present in the first space SP1 and the second space SP2.

The second member 22 may move when the second member 22 and the substrate (object) are not opposite to each other. For example, the second member 22 may move when the object is not present below the second member 22. Moreover, the second member 22 may move when the liquid LQ is not present in the space between the second member 22 and the substrate P (object). For example, the second member 22 may move when the liquid immersion space LS is not formed.

For example, the second member 22 moves based on movement conditions of the substrate P (object). For example, the controller 6 moves the second member 22 in parallel with at least a portion of the movement of the substrate P (object) based on the movement conditions of the substrate P (object). The controller 6 moves the second member 22 while performing the supply of the liquid LQ from the liquid supply part 31 and the recovery of the liquid LQ from the fluid recovery part 27 and the liquid recovery part 24 so that the liquid immersion space LS is continuous to be formed.

In the present embodiment, the second member 22 is able to move so that the relative movement between the second member 22 and the substrate P (object) is decreased. Moreover, the second member 22 is able to move so that the relative movement between the second member and the substrate P (object) is smaller than the relative movement between the first member 21 and the substrate P (object). For example, the second member 22 may move in synchronization with the substrate P (object).

The relative movement includes at least one of a relative speed and a relative acceleration. For example, in a state where the liquid immersion space LS is formed, that is, in a state where the liquid LQ is present in the second space SP2, the second member 22 may move so that the relative speed between the second member 22 and the substrate P (object) is decreased. Moreover, in the state where the liquid immersion space LS is formed, that is, in the state where the liquid LQ is present in the second space SP2, the second member 22 may move so that the relative acceleration between the second member and the substrate P (object) is decreased. Furthermore, in the state where the liquid immersion space LS is formed, that is, in the state where the liquid LQ is present in the second space SP2, the second member 22 may move so that the relative speed between the second member and the substrate P (object) is smaller than the relative speed between the first member 21 and the substrate P (object). Moreover, in the state where the liquid immersion space LS is formed, that is, in a state where the liquid LQ is present in the second space SP2, the second member 22 may move so that the relative acceleration between the second member and the substrate P (object) is smaller than the relative acceleration between the first member 21 and the substrate P (object).

For example, the second member 22 is able to move in the movement direction of the substrate P (object). For example, when the substrate P (object) moves in the +X axis direction (or the −X axis direction), the second member 22 is able to move in the +X axis direction (or the −X axis direction). Moreover, when the substrate P (object) moves in the +Y axis direction (or the −Y axis direction) while moving in the +X axis direction, the second member 22 is able to move in the +X axis direction. Furthermore, when the substrate P (object) moves in the +Y axis direction (or the −Y axis direction) while moving in the −X axis direction, the second member 22 is able to move in the −X axis direction. That is, in the present embodiment, when the substrate P (object) moves in the direction which includes the component of the X axis direction, the second member 22 is able to move in the X axis direction. Furthermore, when the second member 22 is movable in the Y axis direction, the second member 22 may move in the Y axis direction in parallel with at least a portion of the movement which includes the component of the Y axis direction of the substrate P (object).

Figure 9:
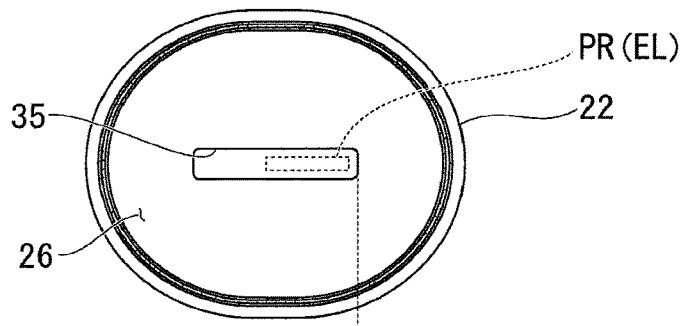
FIG. 9 is a view for explaining an example of an operation of the liquid immersion member according to the first embodiment.
Figure 9:
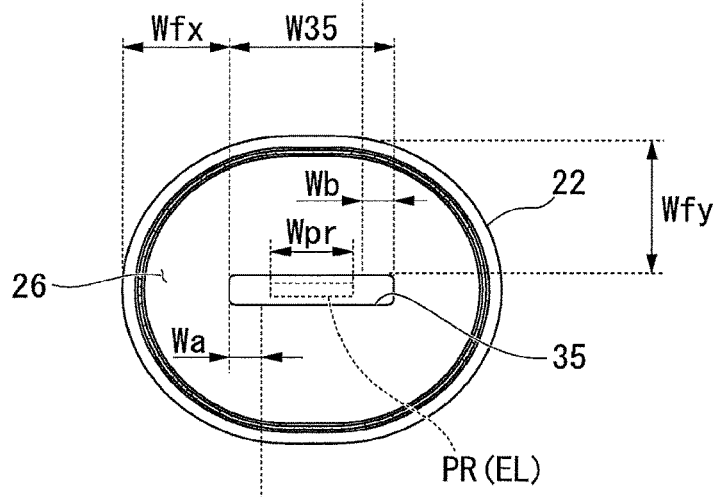
Figure 9:
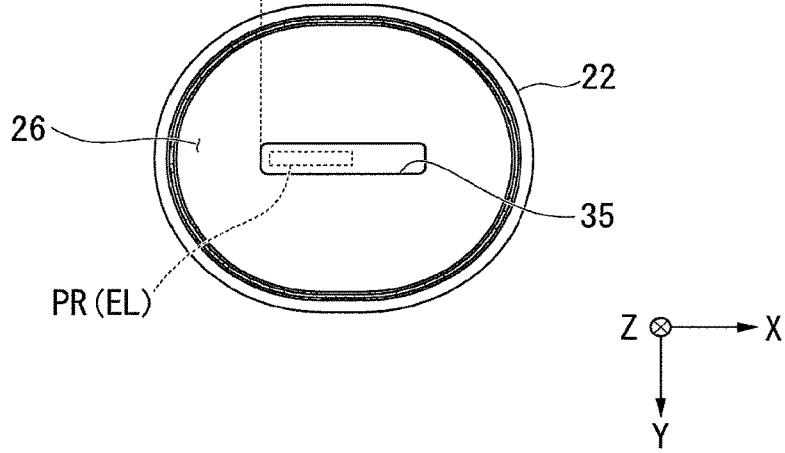

FIG. 9 shows an example of a state where the second member 22 moves. FIG. 9 is a view when the liquid immersion member 5 is viewed from below (−Z axis side).

In the descriptions below, the second member 22 moves in the X axis direction. Moreover, as described above, the second member 22 may move in the Y axis direction and may move in an arbitrary direction in the XY plane which includes the component in the X axis direction (or the Y axis direction).

When the substrate P (object) moves in the X axis direction (or a predetermined direction in the XY plane which includes the component in the X axis direction), as shown in FIGS. 9(A) to 9(C), the second member 22 moves in the X axis direction.

In the present embodiment, the second member 22 is able to move in a movable range which is defined with respect to the X axis direction. FIG. 9(A) shows a state where the second member 22 is disposed at the furthest end of the −X axis side of the movable range. FIG. 9(B) shows a state where the second member 22 is disposed at the center of the movable range. FIG. 9(C) shows a state where the second member 22 is disposed at the furthest end of the movable range of the +X axis side.

In the descriptions below, the position of the second member 22 shown in FIG. 9(A) is appropriately referred to as a first end part position, the position of the second member 22 shown in FIG. 9(B) is appropriately referred to as a center position, and the position of the second member 22 shown in FIG. 9(C) is appropriately referred to as a second end part position. Moreover, as shown in FIG. 9(B), the state where the second member 22 is disposed at the center position is the state where the second member 22 is disposed at the origin.

In the present embodiment, the size of the opening 35 is determined based on the size of the movable range of the second member 22 so that the exposure light EL from the emitting surface 12 passes through the opening 35. In the present embodiment, the size of the movable range of the second member 22 includes the distance between the first end part position and the second end part position with respect to the X axis direction. The size in the X axis direction of the opening 35 is determined so that, even when the second member 22 moves in the X axis direction, the exposure light EL from the emitting surface 12 is not radiated to the second member 22.

In FIG. 9, the size W35 of the opening 35 with respect to the X axis direction is larger than the sum of the size Wpr of the exposure light EL (projection region PR) and the size (Wa+Wb) of the movable range of the second member 22. The size W35 is determined as the size in which, even when the second member 22 moves between the first end part position and the second end part position, the exposure light EL from the emitting surface 12 is not blocked. Accordingly, even when the second member 22 moves, the exposure light EL from the emitting surface 12 is not blocked by the second member 22 and can be radiated to the substrate P (object).

Next, a method for exposing the substrate P using the exposure apparatus EX including the above-described configuration will be described.

In a substrate exchange position away from the liquid immersion member 5, processing which carries (loads) the substrate P before the exposure to the substrate stage 2 (first holding portion) is performed. Moreover, in at least a part of a period in which the substrate stage 2 is away from the liquid immersion member 5, the measurement stage 3 is disposed to be opposite to the terminal optical element 13 and the liquid immersion member 5. The controller 6 performs the supply of the liquid LQ from the liquid supply part 31 and the recovery of the liquid LQ from the fluid recovery part 27, and the liquid immersion space LS is formed at the measurement stage 3.

After the substrate P before the exposure is loaded on the substrate stage 2 and the measurement processing using the measurement stage 3 is terminated, the controller 6 moves the substrate stage 2 so that the terminal optical element 13 and the liquid immersion member 5 are opposite to the substrate stage 2 (substrate P). In the state where the terminal optical element 13 and the liquid immersion member 5 are opposite to the substrate stage 2 (substrate P), the recovery of the liquid LQ from the fluid recovery part 27 is performed in parallel with the supply of the liquid LQ from the liquid supply part 31, and thus, the liquid immersion space LS is formed between the terminal optical element 13 and the liquid immersion member 5, and the substrate stage 2 (substrate P) so that the optical path K is filled with the liquid LQ.

In the present embodiment, the recovery of the liquid LQ from the liquid recovery part 24 is performed in parallel with the supply of the liquid LQ from the liquid supply part 31 and the recovery of the liquid LQ from the fluid recovery part 27.

The controller 6 starts the exposure processing of the substrate P. In the state where the liquid immersion space LS is formed on the substrate P, the controller 6 emits the exposure light EL from the illumination system IL. The illumination system IL illuminates the mask M with the exposure light EL. The exposure light EL from the mask M is radiated to the substrate P via the liquid LQ in the liquid immersion space LS between the projection optical system PL and the emitting surface 12, and the substrate P. Accordingly, the substrate P is exposed by the exposure light EL which is emitted from the emitting surface 12 via the liquid LQ in the liquid immersion space LS between the emitting surface 12 of the terminal optical element 13 and the substrate P, and the image of the pattern of the mask M is projected to the substrate P.

The exposure apparatus EX of the present embodiment is a scanning type exposure apparatus (a so-called scanning stepper) in which the mask M and the substrate P synchronously move in a predetermined scanning direction and the image of the pattern of the mask M is projected to the substrate P. In the present embodiment, the scanning direction of the substrate P (synchronous movement direction) is set to the Y axis direction, and the scanning direction (synchronous movement direction) of the mask M is also set to the Y axis direction. The controller 6 radiates the exposure light EL to the substrate P via the projection optical system PL and the liquid LQ in the liquid immersion space LS on the substrate P while moving the substrate P in the Y axis direction with respect to the projection region PR of the projection optical system PL and moving the mask M in the Y axis direction with respect to the illumination region IR of the illumination system IL in synchronization with the movement in the Y axis direction of the substrate P.

Figure 10:
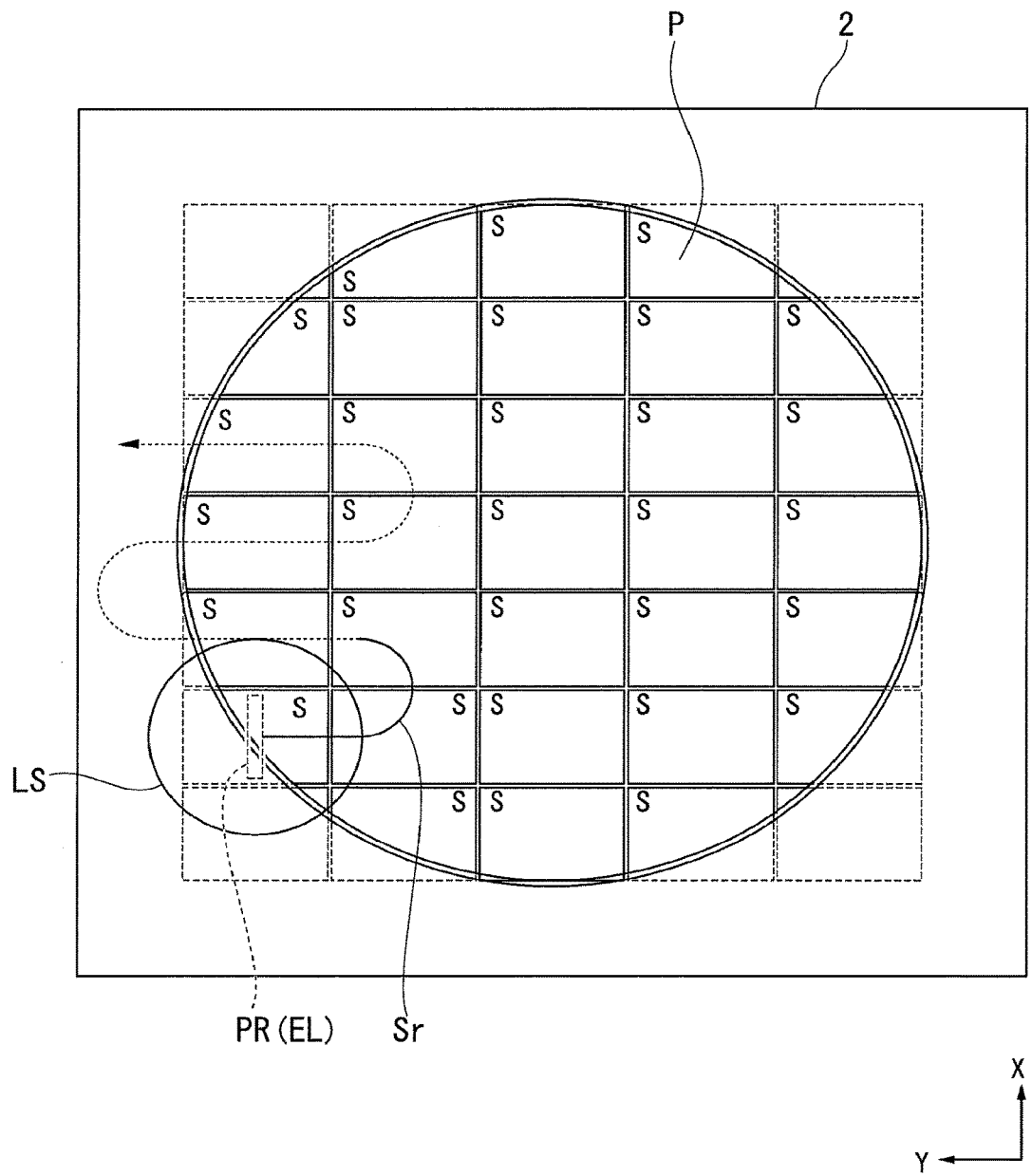
FIG. 10 is a view for explaining an example of the operation of the exposure apparatus according to the first embodiment.

FIG. 10 is a view showing an example of the substrate P which is held by the substrate stage 2. In the present embodiment, a plurality of shot regions S, which are regions to be exposed on the substrate P, are arranged in a matrix form. The controller 6 sequentially exposes the plurality of shot regions S of the substrate P, which is held by the first holding portion, via the liquid LQ in the liquid immersion space LS by the exposure light EL.

For example, in order to expose the first shot region S of the substrate P, in the state where the liquid immersion space LS is formed, the controller 6 radiates the exposure light EL to the first shot region S via the projection optical system PL and the liquid LQ in the liquid immersion space LS on the substrate P while moving the substrate P (first shot region S) in the Y axis direction with respect to the projection region PR of the projection optical system PL, and moving the mask M in the Y axis direction with respect to the illumination region IR of the illumination system IL in synchronization with the movement in the Y axis direction of the substrate P. Accordingly, the image of the pattern of the mask M is projected to the first shot region S of the substrate P, and the first shot region S is exposed by the exposure light EL which is emitted from the emitting surface 12. After the exposure of the first shot region S is terminated, in order to start the exposure of a next second region S, in the state where the liquid immersion space LS is formed, the controller 6 moves the substrate P in the direction (for example, X axis direction, directions which are inclined with respect to the X axis direction and Y axis direction in the XY plane, or the like) which intersects the X axis in the XY plane, and moves the second shot region S to an exposure starting position. Thereafter, the controller 6 starts the exposure of the second shot region S.

The controller 6 repeats the operation which exposes the shot region while moving the shot region in the Y axis direction with respect to the position (projection region PR) irradiated with the exposure light EL from the emitting surface 12 in the state where the liquid immersion space LS is formed above the substrate P (substrate stage 2), and after the exposure of the shot region, the operation which moves the substrate P in the direction (for example, X axis direction, directions which are inclined with respect to the X axis direction and Y axis direction in the XY plane, or the like) which intersects the Y axis direction in the XY plane so that the next shot region is disposed at the exposure start position in the state where the liquid immersion space LS is formed on the substrate P (substrate stage 2), and the controller sequentially exposes the plurality of shot regions of the substrate P.

In the descriptions below, the operation, which moves the substrate P (shot region) in the Y axis direction with respect to the position (projection region PR) irradiated with the exposure light EL from the emitting surface 12 in the state where the liquid immersion space LS is formed above the substrate P (substrate stage 2) in order to expose the shot region, is appropriately referred to as a scan movement operation. Moreover, the operation, which moves the substrate P in the XY plane before the exposure of the next shot region starts in the state where the liquid immersion space LS is formed on the substrate P (substrate stage 2) after the exposure of a predetermined shot region is completed, is appropriately referred to as a step movement operation.

In the scan movement operation, the exposure light EL is emitted from the emitting surface 12. The exposure light EL is radiated to the substrate P (object). In the step movement operation, the exposure light EL is not emitted from the emitting surface 12. The exposure light EL is not radiated to the substrate P (object).

The controller 6 sequentially exposes the plurality of shot regions S of the substrate P while repeating the scan movement operation and the step movement operation. Moreover, the scan movement operation is an equal speed movement only with respect to the Y axis direction. The step movement operation includes acceleration and deceleration movement. For example, the step movement operation between two shot regions adjacent in the X axis direction includes the acceleration and deceleration movement with respect to the Y axis direction and the acceleration and deceleration movement with respect to the X axis direction.

Moreover, there is a case where at least a portion of the liquid immersion space LS may be formed above the substrate stage 2 (cover member T) in at least a portion of the scan movement operation and the step movement operation.

The controller 6 controls the driving system 15 based on exposure conditions of the plurality of shot regions S on the substrate P and moves the substrate P (substrate stage 2). For example, the exposure conditions of the plurality of shot regions S are defined by exposure control information referred to as an exposure recipe. The exposure control information is stored in the storage part 7. The controller 6 sequentially expose the plurality of shot regions S while moving the substrate P by a predetermined movement condition based on the exposure conditions stored in the storage part 7. The movement conditions of the substrate P (object) include at least one of the movement speed, the acceleration, the movement distance, the movement direction, and the movement locus in the XY plane.

As an example, the controller 6 radiates the exposure light EL to the projection region PR while moving the substrate stage 2 so that the projection region PR of the projection optical system PL and the substrate P move along the movement locus shown by an arrow Sr in FIG. 10, and sequentially exposes the plurality of shot regions S of the substrate P via the liquid LQ by the exposure light EL.

Hereinafter, the above-described processing is repeated, and thus, a plurality of substrates P is sequentially exposed.

In the present embodiment, the second member 22 moves in at least a portion of the exposure processing of the substrate P. For example, the second member 22 moves in parallel with at least a portion of the step movement operation of the substrate P (substrate stage 2) in the state where the liquid immersion space LS is formed. In addition, in the present embodiment, for example, the second member 22 moves in parallel with at least a portion of the scan movement operation of the substrate P (substrate stage 2) in the state where the liquid immersion space LS is formed. That is, the exposure light EL is emitted from the emitting surface 12 in parallel with the movement of the second member 22. In addition, the second member 22 may not move during the scan movement operation. That is, the second member 22 may not move in parallel with the emission of the exposure light EL from the emitting surface 12. For example, the second member 22 may move so that the relative movement (relative speed, relative acceleration) between the second member and the substrate P (substrate stage 2) is decreased when the substrate P (substrate stage 2) performs the step movement operation. In addition, the second member 22 may move so that the relative movement (relative speed, relative acceleration) between the second member and the substrate P (substrate stage 2) is decreased when the substrate P (substrate stage 2) performs the scan movement operation.

Figure 11:
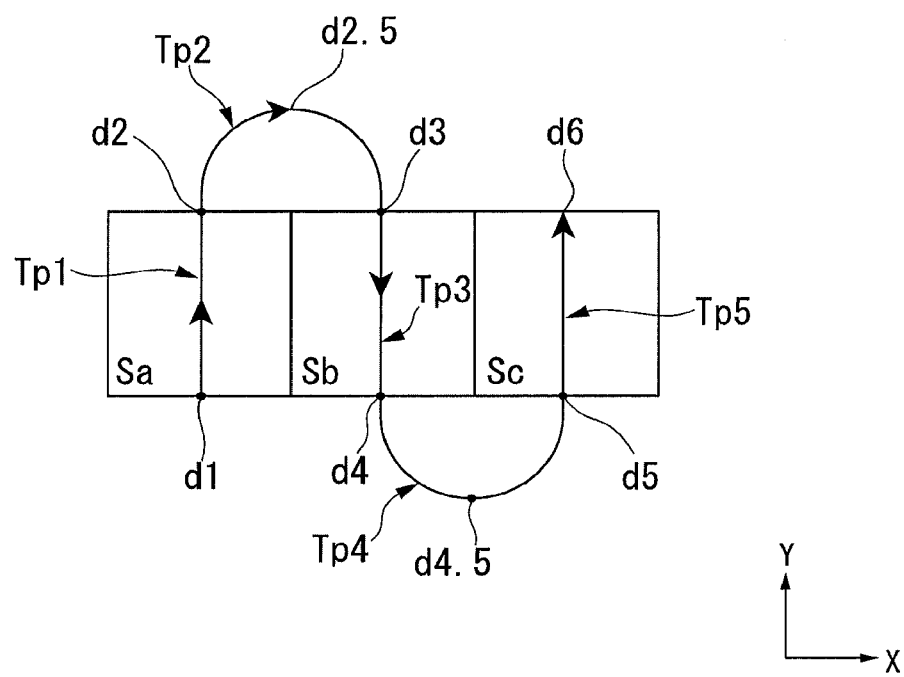
FIG. 11 is a schematic view for explaining an example of the operation of the exposure apparatus according to the first embodiment.

FIG. 11 is a view schematically showing an example of the movement locus of the substrate P when sequentially exposing a shot region Sa, a shot region Sb, and a shot region Sc while performing the step movement which includes the components in the +X axis direction to the substrate P.

As shown in FIG. 11, when the shot regions Sa, Sb, and Sc are exposed, the substrate P sequentially moves a pathway Tp1 from a position d1 to a position d2 adjacent at the +Y axis side with respect to the position d1, a pathway Tp2 from the position d2 to a position d3 adjacent at the +X axis side with respect to the position d2, a pathway Tp3 from the position d3 to a position d4 adjacent at the −Y axis side with respect to the position d3, a pathway Tp4 from the position d4 to a position d5 adjacent at the +X axis side with respect to the position d4, and a pathway Tp5 from the position d5 to a position d6 adjacent at the +Y axis side with respect to the position d5, under the terminal optical element 13. The positions d1, d2, d3, d4, d5, and d6 are positions in the XY plane.

At least a portion of the pathway Tp1 is a straight line parallel to the Y axis. At least a portion of the pathway Tp3 is a straight line parallel to the Y axis. At least a portion of the pathway Tp5 is a straight line parallel to the Y axis. The pathway Tp2 includes a curved line passing through a position d2.5. The pathway Tp4 includes a curved line passing through a position d4.5. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The position d5 includes the start point of the pathway Tp5, and the position d6 includes the end point of the pathway Tp5. The pathway Tp1 is a pathway on which the substrate P moves in the +Y axis direction. The pathway Tp3 is a pathway on which the substrate P moves in the −Y axis direction. The pathway Tp5 is a pathway on which the substrate P moves in the +Y axis direction. The pathway Tp2 and the pathway Tp4 are pathways on which the substrate P moves in the direction which has the +X axis direction as the main component.

When the substrate P moves on the pathway Tp1 in the state where the liquid immersion space LS is formed, the exposure light EL is radiated to the shot region Sa via the liquid LQ. The operation in which the substrate P moves on the pathway Tp1 includes the scan movement operation. When the substrate P moves on the pathway Tp3 in the state where the liquid immersion space LS is formed, the exposure light EL is radiated to the shot region Sb via the liquid LQ. The operation in which the substrate P moves on the pathway Tp3 includes the scan movement operation. Moreover, when the substrate P moves on the pathway Tp5 in the state where the liquid immersion space LS is formed, the exposure light EL is radiated to the shot region Sc via the liquid LQ. The operation in which the substrate P moves on the pathway Tp5 includes the scan movement operation. Furthermore, the operations in which the substrate P moves on the pathway Tp2 and the pathway Tp4 include the step movement operation. When the substrate P moves on the pathway Tp2 and the pathway Tp4, the exposure light EL is not radiated.

Figure 12:
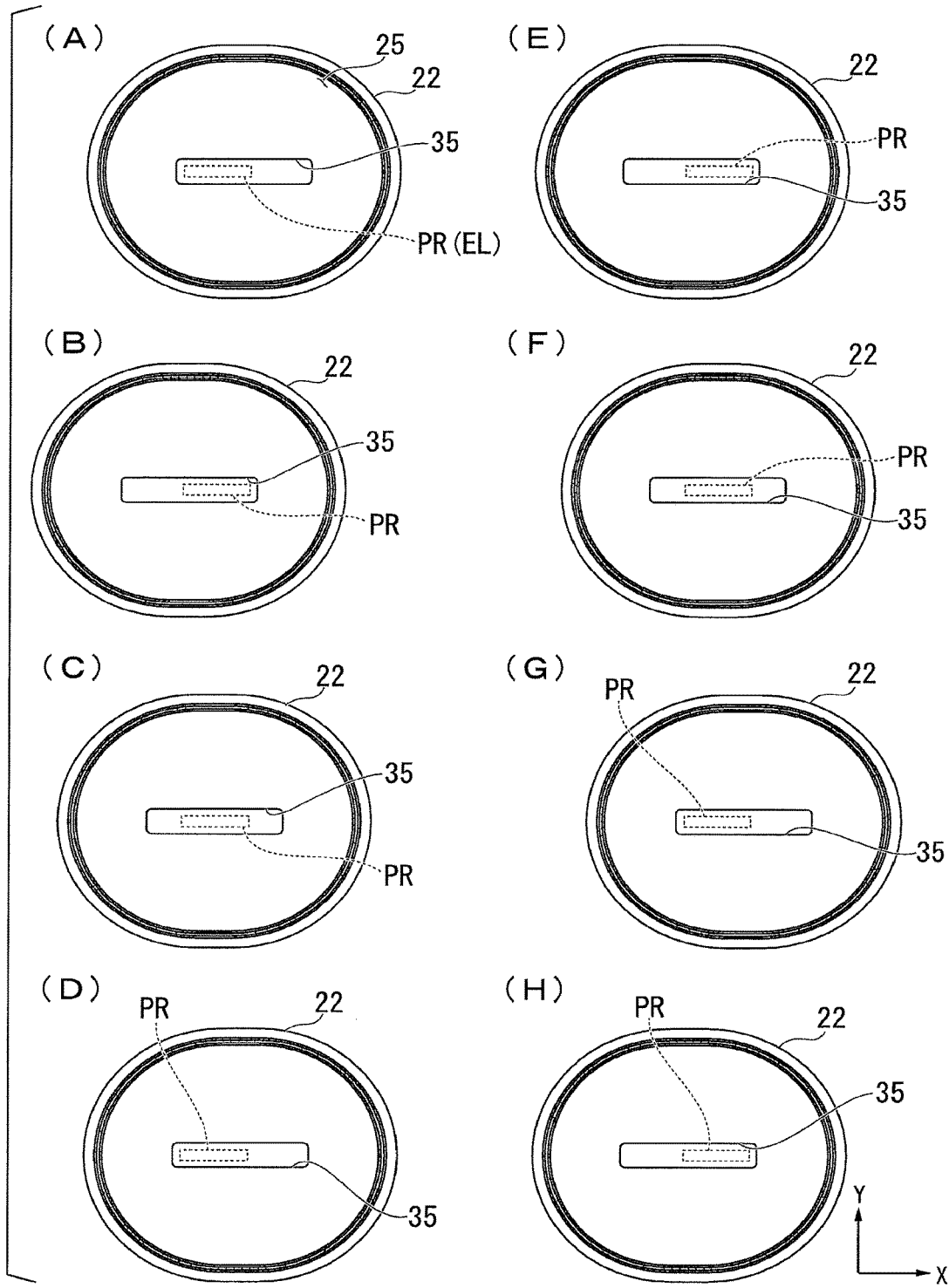
FIG. 12 is a schematic view for explaining an example of the operation of the liquid immersion member according to the first embodiment.

FIG. 12 is a schematic view showing an example of the operation of the second member 22. FIG. 12 is a view when the second member 22 is viewed from the upper surface 25 side. When the substrate P is positioned at the position d1 in FIG. 11, the second member 22 is disposed at the position shown in FIG. 12(A) with respect to the projection region PR (the optical path K of the exposure light EL). When the substrate P is positioned at the position d2, the second member 22 is disposed at the position shown in FIG. 12(B) with respect to the projection region PR (the optical path K of the exposure light EL). That is, during the scan operation movement of the substrate P from the position d1 to the position d2, the second member 22 moves in the −X axis direction, which is reverse to the direction (+X axis direction) of the step movement of the substrate P. When the substrate P is positioned at the position d2.5, the second member 22 is disposed at the position shown in FIG. 12(C) with respect to the projection region PR (the optical path K of the exposure light EL). When the substrate P is positioned at the position d3, the second member 22 is disposed at the position shown in FIG. 12(D) with respect to the projection region PR (the optical path K of the exposure light EL). That is, during the stepping operation movement of the substrate P from the position d2 to the position d3, the second member 22 moves in the +X axis direction, which is the same as the direction (+X axis direction) of the step movement of the substrate P. When the substrate P is positioned at the position d4, the second member 22 is disposed at the position shown in FIG. 12(E) with respect to the projection region PR (the optical path K of the exposure light EL). That is, during the scan operation movement of the substrate P from the position d3 to the position d4, the second member 22 moves in the −X axis direction, which is reverse to the direction (+X axis direction) of the step movement of the substrate P. When the substrate P is positioned at the position d4. 5, the second member 22 is disposed at the position shown in FIG. 12(F) with respect to the projection region PR (the optical path K of the exposure light EL). When the substrate P is positioned at the position d5, the second member 22 is disposed at the position shown in FIG. 12(G) with respect to the projection region PR (the optical path K of the exposure light EL). That is, during the stepping operation movement of the substrate P from the position d4 to the position d5, the second member 22 moves in the +X axis direction, which is the same as the direction (+X axis direction) of the step movement of the substrate P. When the substrate P is positioned at the position d6, the second member 22 is disposed at the position shown in FIG. 12(H) with respect to the projection region PR (the optical path K of the exposure light EL). That is, during the scan operation movement of the substrate P from the position d5 to the position d6, the second member 22 moves in the −X axis direction, which is reverse to the direction (+X axis direction) of the step movement of the substrate P.

In the present embodiment, the positions of the second member 22 shown in FIGS. 12(A), 12(D), and 12(G) include the second end part position. The positions of the second member 22 shown in FIGS. 12(B), 12(E), and 12(H) include the first end part position. The positions of the second member 22 shown in FIGS. 12(C) and 12(F) include the center position.

In the descriptions below, the positions of the second member 22 shown in FIGS. 12(A), 12(D), and 12(G) are set to the second end part position, the positions of the second member 22 shown in FIGS. 12(B), 12(E), and 12(H) are set to the first end part position, and the positions of the second member 22 shown in FIGS. 12(C) and 12(F) are set to the center position.

Moreover, when the substrate P is positioned at the positions d1, d3, and d5 shown in FIG. 11, the second member 22 may be disposed at the center position and may be disposed between of the second end part position and the center position. Moreover, when the substrate P is positioned at the positions d2, d4, and d6, the second member 22 may be disposed at the center position and may be disposed between of the first end part position and the center position. Furthermore, when the substrate P is positioned at the positions d2.5 and d4.5, the second member 22 may be disposed at the positions different from the center position. That is, when the substrate P is positioned at the positions d2.5 and d4.5, the second member 22 may be disposed between the first end part position and the center position or between the second end part position and the center position.

When the substrate P moves on the pathway Tp1, the second member 22 moves in the −X axis direction so as to be changed from the state shown in FIG. 12(A) to the state shown in FIG. 12(B). That is, the second member 22 moves from the second end part position to the first end part position via the center position. When the substrate P moves on the pathway Tp2, the second member 22 moves in the +X axis direction so as to be changed from the state shown in FIG. 12(B) to the state shown in FIG. 12(D) via the state shown in FIG. 12(C). That is, the second member 22 moves from the first end part position to the second end part position via the center position. When the substrate P moves on the pathway Tp3, the second member 22 moves in the −X axis direction so as to be changed from the state shown in FIG. 12(D) to the state shown in FIG. 12(E). That is, the second member 22 moves from the second end part position to the first end part position via the center position. When the substrate P moves on the pathway Tp4, the second member 22 moves in the +X axis direction so as to be changed from the state shown in FIG. 12(E) to the state shown in FIG. 12(G) via the state shown in FIG. 12(F). That is, the second member 22 moves from the first end part position to the second end part position via the center position. When the substrate P moves on the pathway Tp5, the second member 22 moves in the −X axis direction so as to be changed from the state shown in FIG. 12(G) to the state shown in FIG. 12(H). That is, the second member 22 moves from the second end part position to the first end part position via the center position.

That is, in the present embodiment, the second member 22 moves in the +X axis direction so that the relative movement between the second member and the substrate P is decreased in at least a part of the period in which the substrate P moves along the pathway Tp2. In other words, the second member 22 moves in the +X axis direction so that the relative speed between the second member and the substrate P with respect to the X axis direction is decreased in at least a part of the period in which the substrate P performs the step movement operation which includes the component in the +X axis direction. Similarly, the second member 22 moves in the +X axis direction so that the relative speed between the second member and the substrate P with respect to the X axis direction is decreased in at least a part of the period in which the substrate P moves along the pathway Tp4.

Moreover, in the present embodiment, the second member 22 moves in the −X axis direction in at least a part of the period in which the substrate P moves along the pathway Tp3. Accordingly, after the movement of the substrate P on the pathway Tp3, during in the movement of the pathway Tp4, even when the second member 22 moves in the +X axis direction, the exposure light EL is able to pass through the opening 35. Also in the case where the substrate P moves on the pathways Tp1 and Tp5, the exposure light is able to pass through the opening.

That is, when the substrate P repeats the scan movement operation and the step movement operation including the component in the +X axis direction, during the step movement operation, the second member 22 moves in the +X axis direction from the first end part position to the second end part position so that the relative speed between the second member and the substrate P is decreased, and during the scan movement operation, the second member 22 returns from the second end part position to the first end part position so that the second member 22 moves in the +X axis direction again in the next step movement operation. That is, since the second member 22 moves in −X axis direction in at least a part of the period in which the substrate P performs the vertical scan movement operation, the size of the opening 35 is able to be suppressed to the required minimum.

Moreover, in the embodiment, even when the second member 22 is disposed at the first end part position (second end part position), at least a portion of the fluid recovery part 27 is continuously opposite to the substrate P (object). Accordingly, for example, in the step movement operation, the fluid recovery part 27 is able to recover the liquid LQ on the substrate P (object).

Furthermore, in the present embodiment, before the substrate P starts the step movement operation including the component in the +X axis direction, the second member 22 starts the movement from the first end part position to the second end part position. That is, before the substrate P starts the movement in the pathway Tp2 (Tp4), the second member 22 starts the movement in the +X axis direction. Moreover, at the same time as the substrate P starts the step movement operation including the component in the +X axis direction, the second member 22 may start the movement from the first end part position to the second end part position. In other words, at the same time as the substrate P starts the movement in the pathway Tp2 (Tp4), the second member 22 may start the movement in the +X axis direction. Alternatively, after the substrate P starts the movement in the pathway Tp2 (Tp4), the second member 22 may start the movement in the +X axis direction.

Furthermore, in the present embodiment, at the same time as the substrate P starts the scan movement operation, the second member 22 starts the movement from the second end part position to the first end part position. In other words, at the same time as the substrate P starts the movement in the pathway Tp1 (Tp3 and Tp5), the second member 22 starts the movement in the −X axis direction, which is the direction reverse to the direction (+X axis direction) of the step movement of the substrate P. Moreover, after the substrate P starts the movement in the pathway Tp1 (Tp3 and Tp5), the second member 22 may start the movement in the −X axis direction. Alternatively, before the substrate P starts the movement in the pathway Tp1 (Tp3 and Tp5), the second member 22 may start the movement in the −X axis direction.

Figure 13:
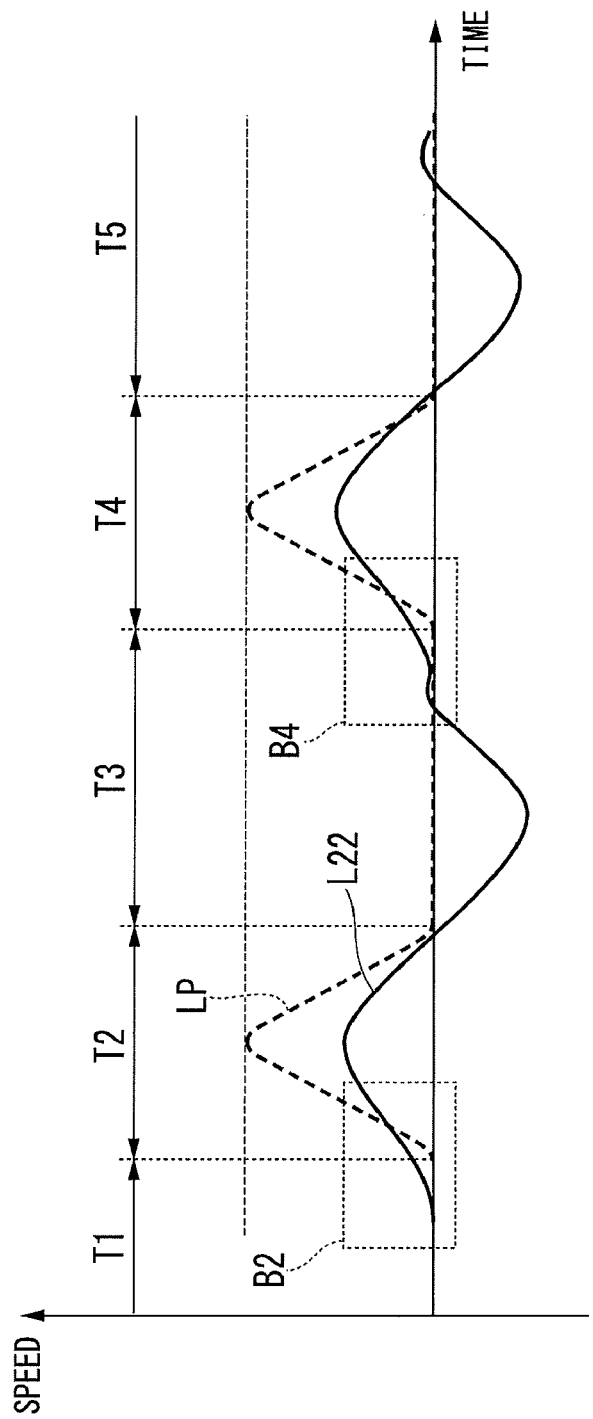
FIG. 13 is a view for explaining an example of the operation of the exposure apparatus according to the first embodiment.

FIG. 13 is a view showing an example of a relationship between the speed of the substrate P (substrate stage 2) and the speed of the second member 22, and time with respect to the X axis direction in the present embodiment. In the graph shown in FIG. 13, the horizontal axis represents the time, and the vertical axis represents the speed. In FIG. 13, a line LP indicates the speed of the substrate P (substrate stage 2), and a line L22 indicates the speed of the second member 22.

In FIG. 13, periods T1, T3, and T5 are periods in which the scan movement operation is performed. That is, the period T1 corresponds to the movement period of the substrate P from the position d1 to the position d2 in FIG. 11. The period T3 corresponds to the movement period of the substrate P from the position d3 to the position d4 in FIG. 11. The period T5 corresponds to the movement period of the substrate P from the position d5 to the position d6 in FIG. 11. Furthermore, periods T2 and T4 are periods in which the step movement operation is performed. That is, the period T2 corresponds to the movement period of the substrate P from the position d2 to the position d3 in FIG. 11. The period T4 corresponds to the movement period of the substrate P from the position d4 to the position d5 in FIG. 11. In FIG. 13, as shown in portions B2 and B4, in the present embodiment, before the substrate P starts the movement in pathways Tp2 and Tp4 (before the substrate P starts the step movement operation including the component in the +X axis direction), the second member 22 starts the movement in the +X axis direction.

Moreover, as shown in FIG. 13, in the present embodiment, the speed of the second member 22 with respect to the X axis direction in the step movement operation is lower than the speed of the substrate P (substrate stage 2). Furthermore, the speed of the second member 22 may be the same as the speed of the substrate P (substrate stage 2) and higher than the speed of the substrate P (substrate stage 2). That is, the substrate P (substrate stage 2) may have higher speed and lower speed than the second member 22, and may have the same speed as the second member 22.

Furthermore, as shown in FIG. 13, in the present embodiment, the acceleration of the second member 22 with respect to the X axis direction in the step movement operation is lower than the acceleration of the substrate P (substrate stage 2). Moreover, the acceleration of the second member 22 may be the same as the acceleration of the substrate P (substrate stage 2) and higher than the acceleration of the substrate P (substrate stage 2).

Furthermore, in the present embodiment, the movement distance of the second member 22 with respect to the X axis direction during the step movement operation period is shorter than the movement distance of the substrate P (substrate stage 2). For example, the movement distance of the second member 22 in the step movement operation may be 45% to 65% of the movement distance of the substrate P (substrate stage 2). For example, the movement distance of the second member 22 may be any of 45%, 50%, 55%, 60%, and 65% of the movement distance of the substrate P (substrate stage 2). In the present embodiment, the movement distance of the second member 22 in the step movement operation is the distance between the first end part position and the second end part position. Moreover, in the present embodiment, the movement distance of the second member 22 with respect to the X axis direction during the step movement operation period is shorter than a distance (distance A) between the center of a predetermined shot region S and the center of the shot region S adjacent in the X axis direction with respect to the short region S. For example, the movement distance of the second member 22 in the step movement operation may be 45% to 65% of the distance A. For example, the movement distance of the second member 22 in the step movement operation may be any of 45%, 50%, 55%, 60%, and 65% of the distance A. Moreover, the movement distance of the second member 22 with respect to the X axis direction in the step movement operation period is shorter than the size (size B) of one shot region S with respect to the X axis direction. For example, the movement distance of the second member 22 in the step movement operation may be 45 to 65% of the size B. For example, the movement distance of the second member 22 in the step movement operation may be any of 45%, 50%, 55%, 60%, and 65% of the size B. For example, when the size (size B) of the shot region S with respect to the X axis direction is 26 mm, the movement distance of the second member 22 may be approximately 14 mm.

For example, the movement distance of the second member 22 may be determined based on the surface conditions of the substrate P. The surface conditions of the substrate P include a contact angle (a receding contact angle or the like) of the liquid LQ on the surface of a photosensitive film which forms the surface of the substrate P. Moreover, the surface conditions of the substrate P include a contact angle (a receding contact angle or the like) of the liquid LQ on the surface of a protective film (top coat film) which forms the surface of the substrate P. Furthermore, for example, the surface of the substrate P may be formed by an antireflection film. Moreover, the movement distance of the second member 22 may be obtained by preliminary experiments or simulation so that the outflow (residue) of the liquid LQ in the step movement operation is suppressed.

Furthermore, the movement distance of the second member 22 may be the same as the movement distance of the substrate P (substrate stage 2) and may be larger than the movement distance of the substrate P (substrate stage 2).

Moreover, in the present embodiment, a distance Wfx between the −X axis side end part of the opening 35 and the −X axis side end part of the second member 22 is equal to or more than the movement distance of the second member 22 with respect to the X axis direction in the step movement operation. Furthermore, in the present embodiment, the distance Wfx between the −X axis side end part of the opening 35 and the −X axis side end part of the second member 22 is the same as the distance between the +X axis side end part of the opening 35 and the +X axis side end part of the second member 22. Moreover, the distance Wfx may be smaller than the movement distance of the second member 22 with respect to the X axis direction in the step movement operation.

Moreover, in the present embodiment, a distance Wfy between the −Y axis side end part of the opening 35 and the −Y axis side end part of the second member 22 is equal to or more than the size of one shot region S with respect to the Y axis direction. For example, when the size of the shot region S with respect to the Y axis direction is 33 mm, the distance Wfy is 33 mm or more. Furthermore, in the present embodiment, the distance Wfy between the −Y axis side end part of the opening 35 and the −Y axis side end part of the second member 22 is the same as the distance between the +Y axis side end part of the opening 35 and the +Y axis side end part of the second member 22.

Moreover, with respect to the Y axis direction, as the present embodiment, the distance between the center of the opening 35 and the outside end part of the second member 22 may be equal to or more than the size of one shot region S with respect to the Y axis direction, and smaller than the size of one shot region S with respect to the Y axis direction.

As described above, according to the present embodiment, since the second member 22, which is movable below the first member 21, is provided, even when the object such as the substrate P moves in the XY plane in the state where the liquid immersion space LS is formed, for example, the liquid LQ is suppressed from flowing out from the space between the liquid immersion member 5 and the object or is suppressed from remaining on the object. Moreover, bubbles (gas portion) are suppressed from being generated in the liquid LQ in the liquid immersion space LS.

Furthermore, since the second member 22 includes the fluid recovery part 27, the change in the shape of the second interface LG2 which is formed between the lower surface of the fluid recovery part 27 and the upper surface of the substrate P (object) is suppressed. Accordingly, the liquid LQ in the liquid immersion space LS is suppressed from flowing out from the space between the liquid immersion member 5 and the substrate P (object) or from remaining on the substrate P (object).

Furthermore, since the second member 22 moves so that the relative movement (relative speed, relative acceleration) between the second member and the substrate P (object) is decreased, even when the object moves at high speed in the state where the liquid immersion space LS is formed, the liquid LQ is suppressed from flowing out or suppressed from remaining on the substrate P (object), or bubbles are suppressed from being generated in the liquid LQ.

Therefore, it is possible to suppress the occurrence of exposure failure and the occurrence of a defective device.

Moreover, in the present embodiment, the first member 21 is disposed at at least a portion of surrounding of the terminal optical element 13. Accordingly, even when the object moves or the second member 22 moves in the state where the liquid immersion space LS is formed, a change of pressure between the terminal optical element 13 and the first member 21 or a large change of the shape of the third interface LG3 of the liquid LQ is suppressed. Therefore, for example, bubbles are suppressed from being generated in the liquid LQ, and an excessive force is suppressed from being applied to the terminal optical element 13. Moreover, in the present embodiment, since the first member 21 does not substantially move, a large change of the pressure between the terminal optical element 13 and the first member 21 or a large change of the shape of the first interface LG1 of the liquid LQ is suppressed.

Furthermore, the first member 21 may be configured to be movable. Moreover, the first member 21 may be relatively movable with respect to the terminal optical element 13. The first member 21 may be movable in at least one direction of six directions of the X axis, Y axis, Z axis, θX, θY, and θZ directions. For example, in order to adjust the positional relationship between the terminal optical element 13 and the first member 21 or the positional relationship between the first member 21 and the second member 22, the first member 21 may be movable. Moreover, the first member 21 may be movable in parallel with at least a portion of the movement of the substrate P (object). For example, the first member 21 may be movable by a distance shorter than the second member 22 in the XY plane. Moreover, the first member 21 may be movable at a speed lower than the second member 22. Furthermore, the first member 21 may be movable at acceleration lower than the second member 22.

Moreover, in the present embodiment, the liquid supply part, 31 which supplies the liquid LQ to form the liquid immersion space LS, is disposed at the first member 21. Furthermore, in the present embodiment, the fluid recovery part 27 which recovers the liquid LQ on the substrate P (object) is disposed at the second member 22 which is disposed via the first member 21 and the gap. Accordingly, the fluid (one or both of liquid LQ and the gas) is recovered from the fluid recovery part 27, and thus, even when the temperature of the second member 22 is changed, the change in the temperature of the first member 21 is suppressed. Therefore, the change in the temperature of the liquid LQ supplied from the liquid supply part 31 is suppressed.

Moreover, in the present embodiment, the liquid LQ supplied from the liquid supply part 31 flows so as to contact the inner surface 28 and the lower surface 23 of the first member 21. The change in the temperature of the first member 21 is suppressed by the liquid LQ. Moreover, the temperature of the first member 21 is adjusted by the liquid LQ. Furthermore, the liquid LQ supplied from the liquid supply part 31 flows so as to contact the upper surface 25 and the lower surface 26 of the second member 22. The change in the temperature of the second member 22 is suppressed by the liquid LQ. Moreover, the temperature of the second member 22 is adjusted by the liquid LQ.

Furthermore, a first temperature adjustment apparatus (not shown) which adjusts the temperature of the first member 21 may be provided. For example, the first temperature adjustment apparatus may include a peltier device which is disposed at the outer surface of the first member 21. The first temperature adjustment apparatus may include a supply device (not shown) which supplies the fluid (one or both of the liquid and the gas) for adjusting the temperature to the channel which formed in the inner portion of the first member 21. Furthermore, a second temperature adjustment apparatus (not shown) which adjusts the temperature of the second member 22 may be provided. The second temperature adjustment apparatus may include a peltier device which is disposed at the outer surface of the second member 22 and a supply device (not shown) which supplies the fluid for adjusting the temperature to the channel which formed in the inner portion of the second member 22.

Moreover, in the present embodiment, a supply amount of the liquid from the liquid supply part 31 may be adjusted based on the movement conditions of the second member 22. Furthermore, the supply amount of the liquid from the liquid supply part 31 may be adjusted based on the position of the second member 22. For example, the supply amount of the liquid from the liquid supply part 31 when the second member 22 is disposed at at least one of the first end part position and the second end part position may be adjusted so as to be larger than the supply amount of the liquid from the liquid supply part 31 when the second member 22 is disposed at the center position. Moreover, when the second member 22 moves from the second end part position to the first end part position, the supply amount of the liquid from the liquid supply part 31 which is disposed at the +X axis side with respect to the optical path K may be adjusted so as to be larger than the supply amount of the liquid from the liquid supply part 31 which is disposed at the −X axis side. Furthermore, when the second member 22 moves from the first end part position to the second end part position, the supply amount of the liquid from the liquid supply part 31 which is disposed at the −X axis side with respect to the optical path K may be adjusted so as to be larger than the supply amount of the liquid from the liquid supply part 31 which is disposed at the +X axis side. Accordingly, bubbles are suppressed from being generated in the liquid LQ.

Moreover, in the present embodiment, in order to suppress the residue of the liquid LQ due to the step movement operation of the substrate P, the second member 22 is moved in the step direction (X axis direction) during the step movement operation of the substrate P. However, in order to suppress the residue of the liquid LQ due to the scan movement operation of the substrate P, the second member 22 may be moved in the scan direction (Y axis direction) during the scan movement operation of the substrate P.

Second Embodiment

A second embodiment will be described. In the descriptions below, the same reference numerals are used to describe the same or similar components as those of the first embodiment, and the descriptions thereof are simplified or omitted.

Figure 14:
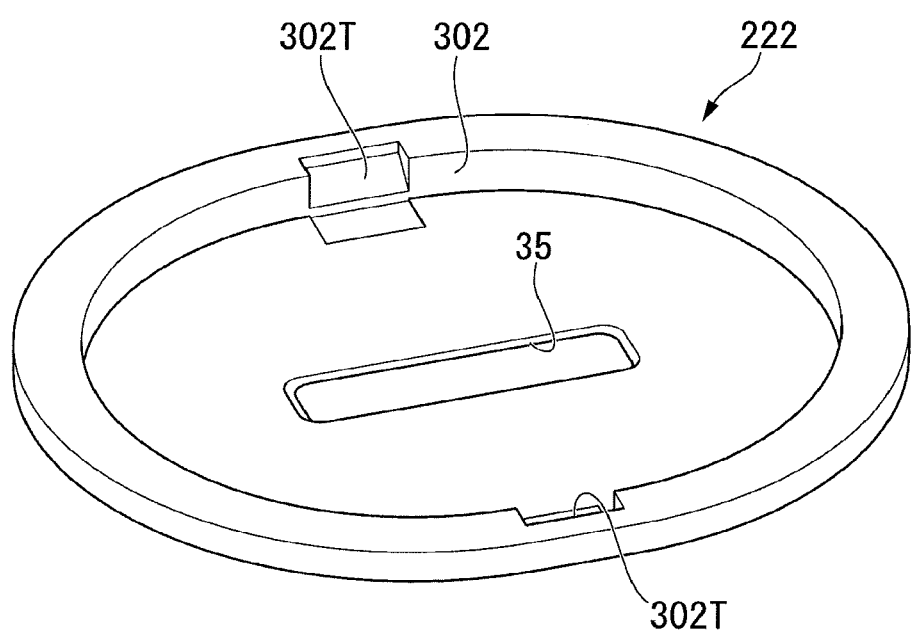
FIG. 14 is a view showing a portion of a liquid immersion member according to a second embodiment.
Figure 15:
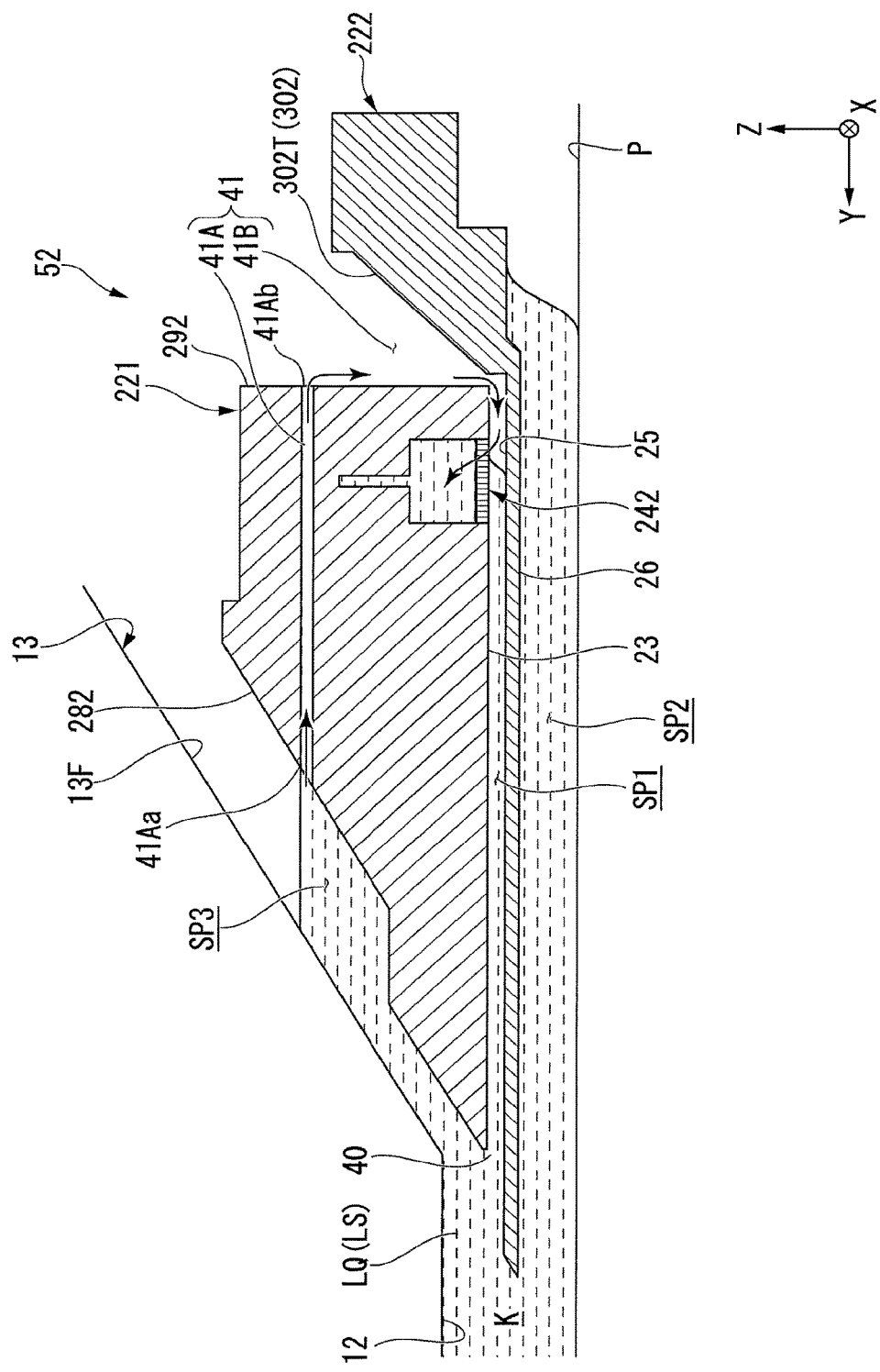
FIG. 15 is a side cross-sectional view showing a portion of the liquid immersion member according to the second embodiment.

FIG. 14 is a perspective view showing an example of a second member 222 according to the present embodiment. FIG. 15 shows a cross-sectional view parallel to the YZ plane showing a portion of a liquid immersion member 52 according to the present embodiment.

In the present embodiment, the liquid immersion member 52 includes a channel 41 which is provided so that at least a portion of the liquid LQ between the side surface 13F of the terminal optical element 13 and an inner surface 282 of a first member 221 flows to the upper surface 25 of the second member 222 at the outside of the first member 221 with respect to the optical path K. That is, the liquid immersion member 52 includes the channel 41 which is provided so that at least a portion of the liquid LQ in the third space SP3 flows to the upper surface 25 of the second member 222 without passing through the opening 40.

The channel 41 includes an inner channel 41A which is formed in the inner portion of the first member 221, and a channel 41B which is formed between an outer surface 292 of the first member 221 and an inner surface 302 of the second member 222. The inner channel 41A is formed so as to connect the inner surface 282 and the outer surface 292 of the first member 221.

In the present embodiment, the inner surface 302 of the second member 222 includes a recessed part 302T. In the present embodiment, the recessed part 302T is formed in each of the +Y axis side and the −Y axis side with respect to the optical path K. The channel 41B is disposed between the outer surface 292 of the first member 221 and the recessed part 302T of the second member 222.

Moreover, the recessed part 302T may be provided at any location with respect to the optical path K. Furthermore, the recessed part 302T may be one or three or more in the number. For example, in addition to the two recessed parts 302T, the recessed part 302T may be provided at the +X axis side, the −X axis side, or both of the +X axis side and the −X axis side with respect to the optical path K. Moreover, for example, instead of the two recessed parts 302T, the recessed part 302T may be provided at the +X axis side, the −X axis side, or both of the +X axis side and the −X axis side with respect to the optical path K. Furthermore, the recessed part 302T may be provided at the entire inner surface 302 of the second member 222.

An opening (inlet) 41Aa which is one end of the inner channel 41A is disposed above from the emitting surface 12. At least a portion of the liquid LQ in the third space SP3 flows into the inner channel 41A via the opening (inlet) 41Aa which is one end of the inner channel 41A facing the third space SP3. The liquid LQ, which flows into the inner channel 41A, flows out from an opening (outlet) 41Ab which is the other end of the inner channel 41A disposed at the outer surface 292. The liquid LQ, which is flowed out from the outlet 41Ab, is supplied to the channel 41B between the outer surface 292 and the recessed part 302T. At least a portion of the liquid LQ supplied to the channel 41B is supplied to the upper surface 25 of the second member 222.

The liquid immersion member 52 includes a liquid recovery part 242 which recovers at least a portion of the liquid LQ which flows to the upper surface 25 via the channel 41. In the present embodiment, at least a portion of the liquid LQ at the upper surface 25 may also flow to the first space SP1 between the lower surface 23 of the first member 221 and the upper surface 25 of the second member 222. In the present embodiment, the liquid recovery part 242 is disposed so as to face the upper surface 25. The liquid LQ, which flows to the upper surface 25 via the channel 41, is recovered from the liquid recovery part 242. The liquid recovery part 242 in the present embodiment may be referred to as fluid recovery part. Additionally, the liquid recovery part 242 may recover the liquid LQ along with gas, and may only recover gas when the liquid LQ is not present below the liquid recovery part 242.

The liquid recovery part 242 may recover the liquid LQ which flows into the first space SP1 via the opening 40. That is, the liquid recovery part 242 may recover both the liquid LQ which flows into the first space SP1 via the opening 40 and the liquid LQ which flows above the upper surface 25 via the channel 41. That is, the liquid recovery part 242 may be used as a recovery part that recovers a liquid LQ which flows from the third space SP3 to the first space SP1 without passing through the opening 40, and may be used as a recovery part that recovers a liquid LQ which flows the first space SP1 via the opening 40.

Moreover, the liquid LQ, which flows above the upper surface of the first member 221 from the third space SP3, may flow to the channel 41B between the first member 221 and the second member 222. In this case, the channel 41A may be provided or may not be provided.

Furthermore, the liquid recovery part 242 which recovers the liquid LQ from the channel 41 may be separated from the fluid recovery part which recovers the liquid LQ which flows into the first space SP1 via the opening 40. Moreover, the liquid recovery part 242 which recovers the liquid LQ from the channel 41 may not face the upper surface 25. For example, the liquid recovery part 242 may be disposed at at least a portion of the outer surface 292. The liquid recovery part 242 may be disposed at the second member 222. For example, the liquid recovery part 242 may be disposed at the inner surface 302 (recessed part 302T). The liquid recovery part 242 may be disposed at members other than the first member 221 and the second member 222.

Third Embodiment

Next, a third embodiment will be described. In the descriptions below, the same reference numerals are used to describe the same or similar components as those of the above-described embodiments, and the descriptions thereof are simplified or omitted.

Figure 16:
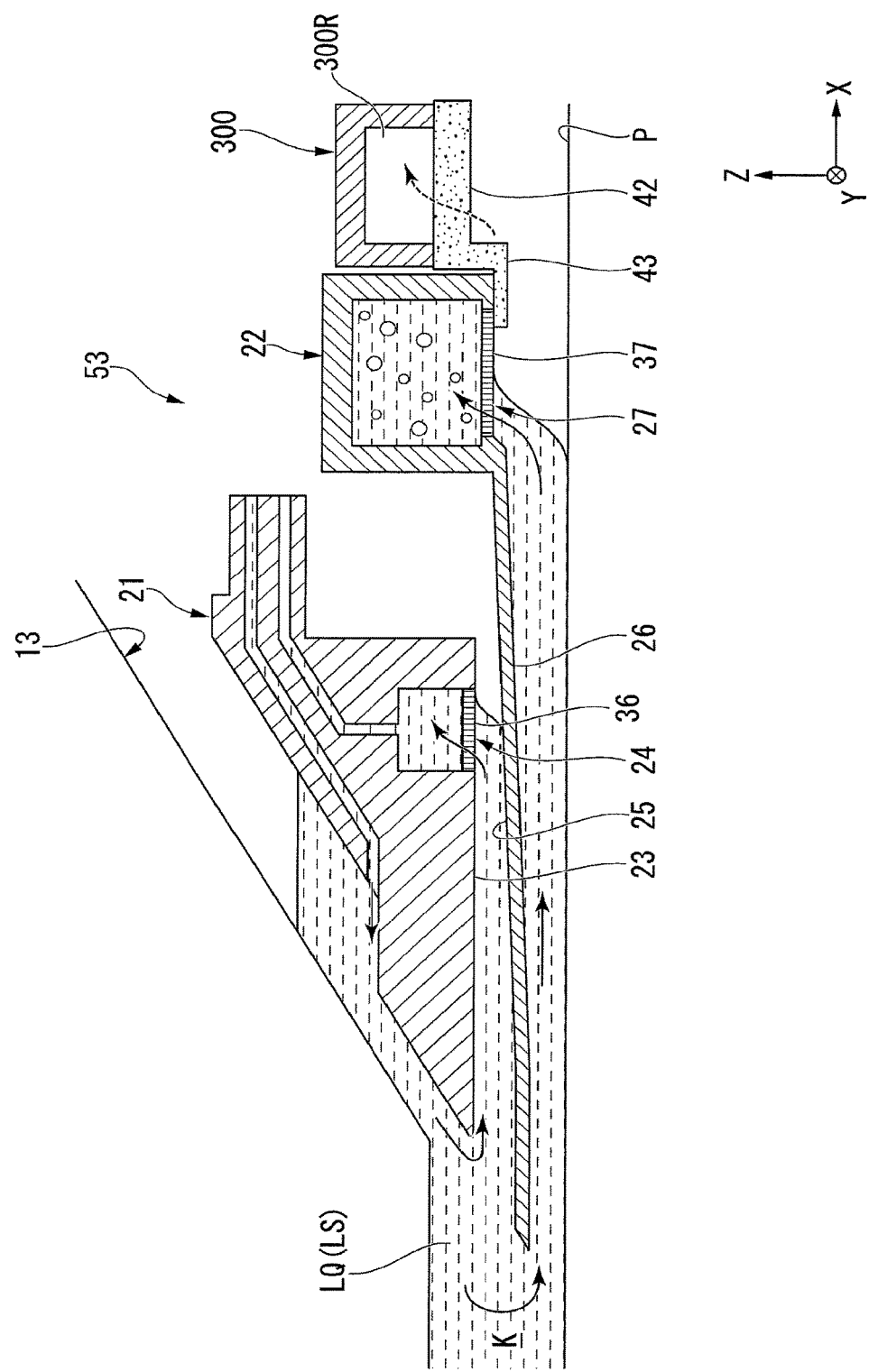
FIG. 16 is a view showing an example of a liquid immersion member according to a third embodiment.

FIG. 16 is a side cross-sectional view showing a portion of a liquid immersion member 53 according to the present embodiment. In FIG. 16, the liquid immersion member 53 includes the first member 21, the second member 22, and a third member 300 which is disposed outside the second member 22 with respect to the optical path K (the optical axis of the terminal optical element 13) and is able to recover the fluid (one or both of the liquid LQ and the gas).

The third member 300 includes a recovery port 42 which is able to be opposite to the substrate P (object). In the present embodiment, the third member 300 includes a porous member 43 disposed at a position which is able to be opposite to the substrate P (object). The recovery port 42 includes holes of the porous member 43. The third member 300 recovers the fluid via the holes of the porous member 43.

A recovery channel 300R through which the fluid recovered from the recovery port (holes of the porous member) 42 flows is provided at the inner portion of the third member 300. The recovery channel 300R is connected to a fluid recovery apparatus (suction apparatus) (not shown). The liquid LQ which is recovered from the recovery port 42 and flows to the recovery channel 300R is recovered by the fluid recovery apparatus.

In the present embodiment, the porous member 43 includes a sintered member. The porous member 43 includes a porous member which is formed by a sintering process or the like. The holes of the porous member 43 are smaller than holes of the porous member 37.

In the present embodiment, the third member 300 moves along with the second member 22. In the present embodiment, the third member 300 is connected to the second member 22.

In the present embodiment, at least a portion of the porous member 43 is disposed below the lower surface of the porous member 37.

Since the third member 300 is provided, the liquid LQ which is not able to be recovered by the fluid recovery part 27 of the second member 22 is recovered from the third member 300. Moreover, the porous member 300 is able to absorb the liquid LQ on the substrate P (object). Accordingly, even when the liquid LQ is flowed out from the space between the second member 22 and the substrate P (object), the liquid LQ is suppressed from being flowed to the outside of the space between the third member 300 and the substrate P (object).

Furthermore, the possibility that a phenomenon (a so-called bridge phenomenon), in which the liquid LQ remains between the porous member 43 and the substrate P (object), occurs is lower than the possibility that a phenomenon (a so-called bridge phenomenon), in which the liquid LQ remains between the porous member 37 and the substrate P (object), occurs. Accordingly, the liquid LQ is suppressed from remaining on the substrate P (object). Therefore, occurrence of exposure failure and occurrence of a defective device are suppressed.

Moreover, since the third member 300 is provided, the porous member 37 of the second member 22 is able to be separated from the substrate P (object). Accordingly, occurrence of the phenomenon (bridge phenomenon) in which the liquid LQ remains between the porous member 37 and the substrate P (object) can be suppressed.

Moreover, in the present embodiment, at least a portion of the lower surface 26 of the second member 22 is inclined upwardly and outwardly in a radial direction from the optical path K. Accordingly, the liquid LQ is favorably maintained between the second member 22 and the substrate P (object).

Moreover, in the present embodiment, the lower surface 26 may not be inclined. The lower surface 26 may be substantially parallel to the XY plane.

Furthermore, in the present embodiment, the recovery channel 300R may not be provided. That is, the porous member 37 may not be connected to the fluid recovery apparatus (suction apparatus), and the liquid LQ may be absorbed only by the porous member 37.

Moreover, in the present embodiment, the third member 300 may not be provided.

Furthermore, in the above-described first and second embodiments, at least a portion of the lower surface 26 of the second member 22 (222) may be inclined upwardly and outwardly in a radial direction from the optical path K.

Moreover, in the above-described first and second embodiments, the third member 300 may be provided.

Figure 17:
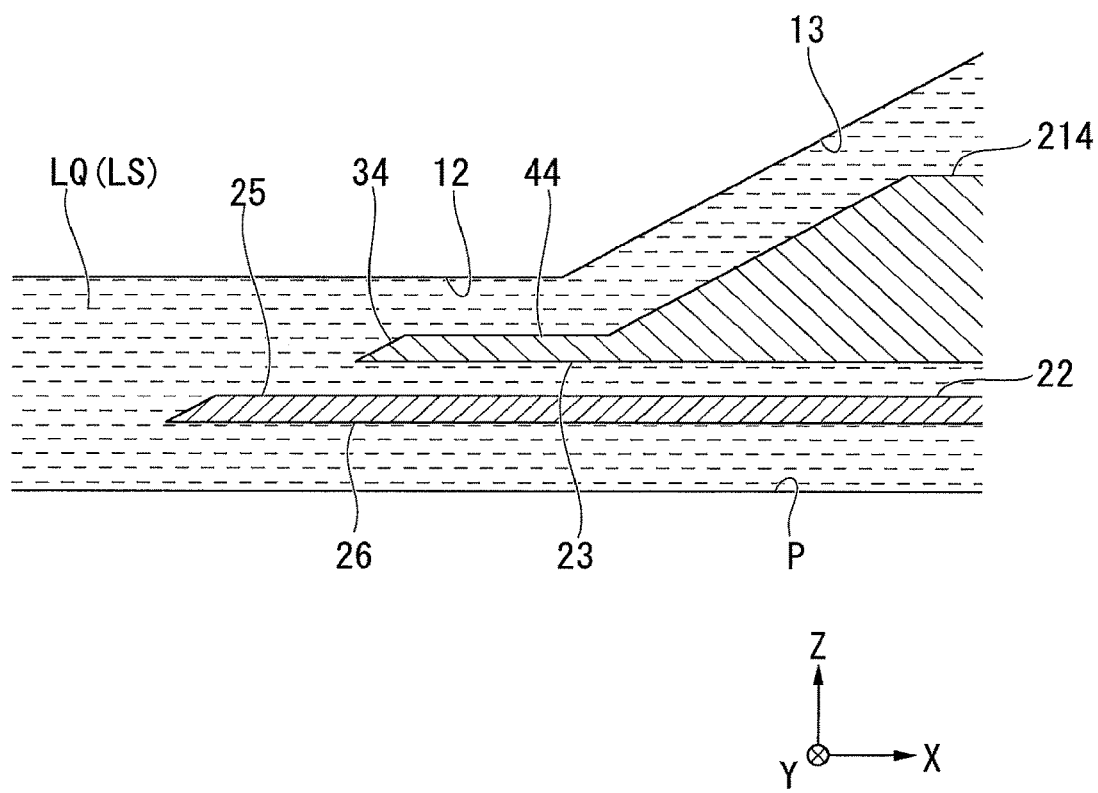
FIG. 17 is a view showing an example of the liquid immersion member.

Furthermore, in the above-described first, second, and third embodiments, as shown in FIG. 17, at least a portion of the first member 214 may be opposite to the emitting surface 12 of the terminal optical element 13. In the example shown in FIG. 17, the first member 214 includes an upper surface 44 which is disposed at surrounding of the opening 34. The upper surface 44 is disposed at surrounding of the upper end of the opening 34. The lower surface 23 is disposed at surrounding of the lower end of the opening 34. A portion of the upper surface 44 is opposite to the emitting surface 12. Moreover, in the example shown in FIG. 17, a portion of the upper surface 25 of the second member 22 is also opposite to the emitting surface 12. The upper surface 44 may be referred to as a first upper surface.

Figure 18:
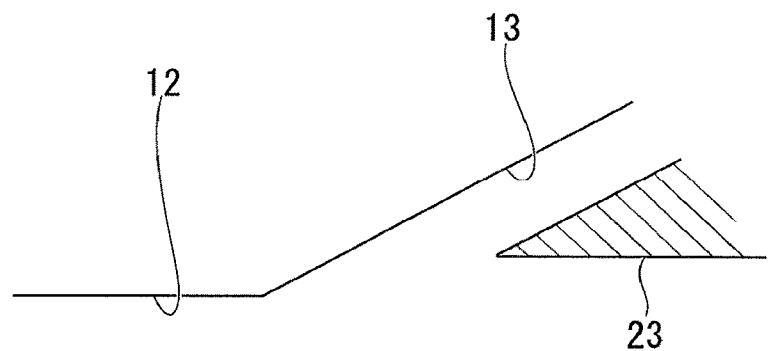
FIG. 18 is a view showing an example of the liquid immersion member.

Furthermore, as shown in FIG. 18, the lower surface 23 of the first member may be disposed at more +Z axis side than the emitting surface 12. Moreover, the position (height) of the lower surface 23 and the position (height) of the emitting surface 12 with respect to the Z axis direction may be substantially the same as each other. The lower surface 23 of the first member may be disposed at more −Z axis side than the emitting surface 12.

Figure 19:
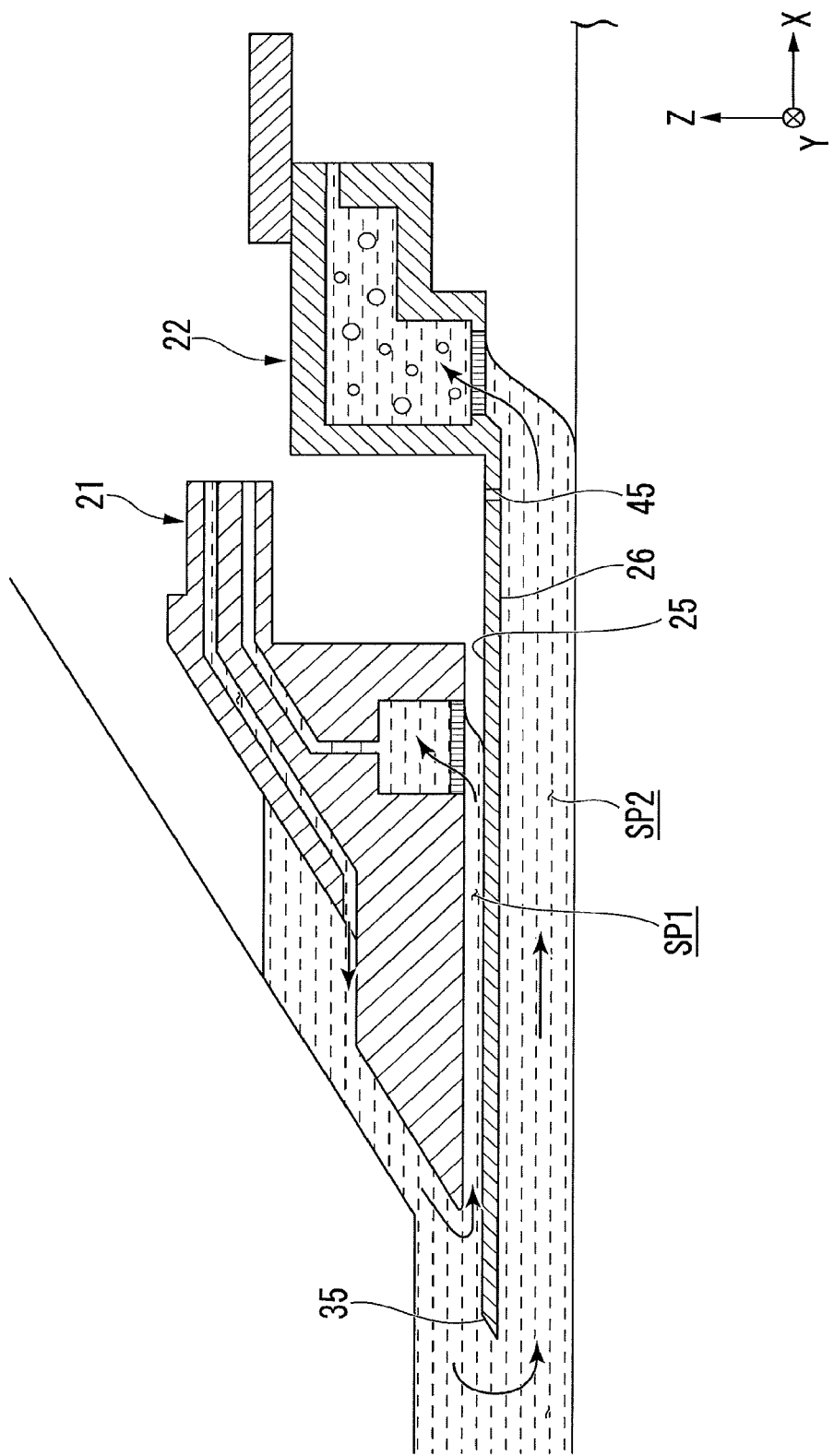
FIG. 19 is a view showing an example of the liquid immersion member.

Moreover, in each embodiment described above, the liquid immersion member 5 does not include the channel which fluidly connects the first space SP1 and the second space SP2 except for the opening 35. As shown in FIG. 19, an opening (hole) 45 which fluidly connects the first space SP1 and the second space SP2 may be formed outside than the opening 35 with respect to the optical path K. In the example shown in FIG. 19, the opening 45 is formed to connect the upper surface 25 and the lower surface 26. The size of the opening 45 is smaller than the size of the opening 35. The movement of the liquid LQ in the opening 45 is further suppressed than the movement of the liquid LQ in the opening 35.

Figure 20:
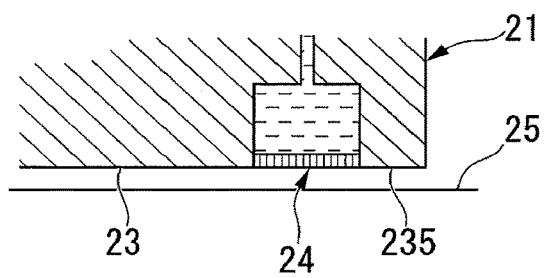
FIG. 20 is a view showing an example of a first member.

Moreover, in FIG. 20, a lower surface 235 of the first member 21 outside from the liquid recovery part 24 with respect to the optical path K may have a liquid repellent property to the liquid LQ. In FIG. 20, the lower surface 235 includes a surface of a film having a liquid repellent property which includes fluorine. Accordingly, occurrence of the above-described bridge phenomenon can be suppressed.

Figure 21:
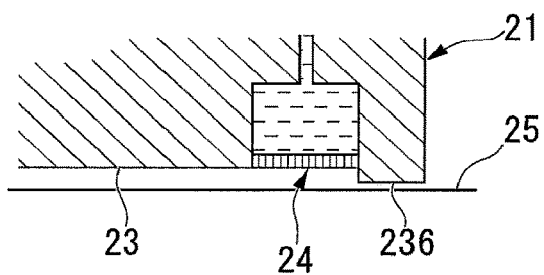
FIG. 21 is a view showing an example of the first member.

Moreover, as shown in FIG. 21, a lower surface 236 of the first member 21 outside than the liquid recovery part 24 with respect to the optical path K may be disposed at more −Z axis side than the lower surface of the liquid recovery part 24. The size of the lower surface 236 and the upper surface 25 may be smaller than the size of the lower surface and the upper surface 25 of the liquid recovery part 24.

Figure 22:
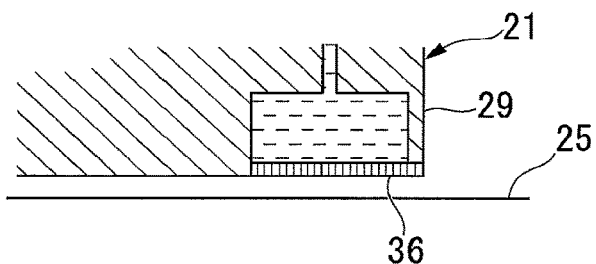
FIG. 22 is a view showing an example of the first member.

Furthermore, as shown in FIG. 22, in the first member 21, the edge of the porous member 36 and the outer surface 29 may be connected to each other.

Figure 23:
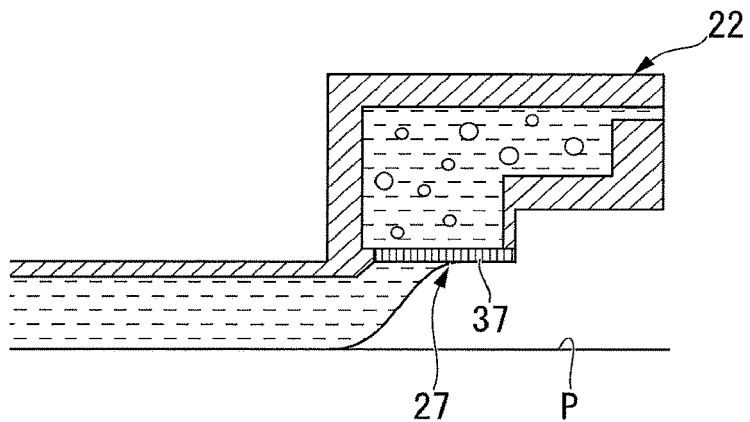
FIG. 23 is a view showing an example of a second member.

Moreover, in each embodiment described above, in the second member 22, the lower surface of the fluid recovery part 27 is disposed at more +Z axis side than the lower surface 26. However, the lower surface of the fluid recovery part 27 may be disposed at more −Z axis side than the lower surface 26. The position (height) of the lower surface of the fluid recovery part 27 and the position (height) of the lower surface 26 with respect to the Z axis direction may be substantially the same as each other. The lower surface of the second member 22 outside than the fluid recovery part 27 with respect to the optical path K may have a liquid repellent property to the liquid LQ. The lower surface may include a surface of a film having a liquid repellent property which includes fluorine. As shown in FIG. 23, in the second member 22, the edge of the porous member 37 and the outer surface may be connected to each other.

Furthermore, in each embodiment described above, a suction port, which sucks at least one of the liquid LQ and the gas from the space between the first member 21 and the terminal optical element 13, may be provided at the first member 21.

Moreover, in each embodiment described above, the supply port (liquid supply part) which supplies the liquid LQ to the first space SP1 may be provided at at least one of the first member 21 and the second member 22. For example, the supply port (liquid supply part) which supplies the liquid LQ may be provided between the opening 34 of the lower surface 23 of the first member 21 and the liquid recovery part 24. Furthermore, in addition to the liquid supply part 31, when a liquid supply part which supplies the liquid to the first space SP1 is provided, the liquid LQ which is supplied from the liquid supply part 31 may not flow into the first space SP1. Moreover, in addition to the liquid supply part 31, when a liquid supply part which supplies the liquid to the first space SP1 is provided, the liquid supplied from the liquid supply part may be different from the liquid LQ supplied from the liquid supply part 31.

Moreover, in each embodiment described above, the second member (22 and the like) may be movable to a position where a portion of the second member (22 and the like) locates in the optical path K of the exposure light. For example, during at least a part of the period in which the exposure light is not radiated from the emitting surface 12 of the terminal optical element 13, the portion of the second member 22 may be disposed at at least a part of the optical path K of the exposure light.

Furthermore, in the above-described embodiment, the controller 6 includes a computer system which includes a CPU or the like. Moreover, the controller 6 includes an interface which is able to perform communication with the computer system and an external apparatus. For example, the storage part 7 includes a memory such as a RAM, a hard disk, and a recording medium such as a CD-ROM. In the storage part 7, an operating system (OS) which controls the computer system is installed and a program for controlling the exposure apparatus EX is stored.

Moreover, an input apparatus which is able to input signals may be connected to the controller 6. The input apparatus includes input equipment such as a keyboard or a mouse, a communication apparatus or the like which is able to input data from the external apparatus, and the like. Moreover, a display apparatus such as a liquid crystal display may be also provided.

The controller (computer system) 6 is able to read various information which includes the programs which are recorded in the storage part 7. Programs are recorded in the storage part 7, and the programs make the controller 6 perform the control of the liquid immersion exposure apparatus which exposes the substrate by the exposure light via the liquid filled in the optical path of the exposure light between the emitting surface of the optical member from which the exposure light is emitted and the substrate.

According to the above-described embodiments, the programs which are recorded in the storage part 7 may make the controller 6 perform: forming a liquid immersion space of the liquid above the substrate that is able to move below the optical member, using a liquid immersion member that comprises a first member disposed at at least a portion of surrounding of the optical member, and a second member that is disposed at at least a portion of surrounding of an optical path of the exposure light below the first member and that comprises a second upper surface opposite to a first lower surface of the first member via a gap, a second lower surface that is able to be opposite to the substrate, and a fluid recovery part disposed at at least a portion of surrounding of the second lower surface; exposing the substrate by the exposure light emitted from the emitting surface via the liquid in the liquid immersion space; and relatively moving the second member with respect to the first member during at least a portion of the exposure of the substrate.

The programs which are stored in the storage part 7 are read by the controller 6, and thus, various apparatuses of the exposure apparatus EX such as the substrate stage 2, the measurement stage 3, and the liquid immersion member 5 cooperate with one another and perform various processing such as the liquid immersion exposure of the substrate P in the state where the liquid immersion space LS is formed.

Moreover, in each embodiment described above, the optical path K at the emitting surface 12 side (image surface side) of the terminal optical element 13 of the projection optical system PL is filled with the liquid LQ. However, for example, the projection optical system PL may be the projection optical system in which the optical path of the incident side (object surface side) at the terminal optical element 13 is also filled with the liquid LQ as disclosed in PCT International Publication No. WO 2004/019128.

Furthermore, in each embodiment described above, the liquid LQ is water. However, the liquid may be liquid other than the water. It is preferable that the liquid LQ be transparent with respect to the exposure light EL, have high refractive index with respect to the exposure light EL, and be stable with respect to the projection optical system PL or the film of a photosensitive material (photoresist) which forms the surface of the substrate P or the like. For example, the liquid LQ may be fluorinated liquid such as hydrofluoroether (HFE), perfluorinated polyether (PFPE), and Fomblin® oil. Moreover, the liquid LQ may be various fluids, for example, supercritical liquid.

Furthermore, in each embodiment described above, the substrate P includes a semiconductor wafer for manufacturing a semiconductor device. However, for example, the substrate may include a glass substrate for a display device, a ceramic wafer for a thin film magnetic head, a mask or an original plate (synthetic quartz, silicon wafer) of a reticle which is used in an exposure apparatus, or the like.

Moreover, in each embodiment described above, the exposure apparatus EX is a scanning type exposure apparatus (scanning stepper) of a step-and-scan system in which the mask M and the substrate P synchronously move and the patterns of the mask M are scanned and exposed. However, for example, the exposure apparatus may be a projection exposure apparatus (stepper) of a step-and-repeat system in which patterns of the mask M are collectively exposed in a state where the mask M and the substrate P are stationary and the substrate P is sequentially step-moved.

Furthermore, the exposure apparatus EX may be an exposure apparatus (a collective exposure apparatus of a stitch system) in which, in the exposure of a step-and-repeat system, after the reduced image of a first pattern is transferred on the substrate P using the projection optical system in a state where a first pattern and the substrate P are substantially stationary, the reduced image of a second pattern is partially overlapped with the first pattern using the projection optical system and is collectively exposed on the substrate P in a state where the second pattern and the substrate P are substantially stationary. Moreover, the exposure apparatus of the stitch system may be an exposure apparatus of a step-and-stitch system in which at least two patterns are partially overlapped on the substrate P and transferred thereto, and the substrate P is sequentially moved.

Furthermore, for example, the exposure apparatus EX may be an exposure apparatus in which patterns of two masks are combined on the substrate via the projection optical system and one shot region on the substrate is approximately simultaneously double-exposed by single scanning exposure, as disclosed in U.S. Pat. No. 6,611,316. Moreover, the exposure apparatus EX may be an exposure apparatus of a proximity system, a mirror projection aligner, or the like.

Figure 24:
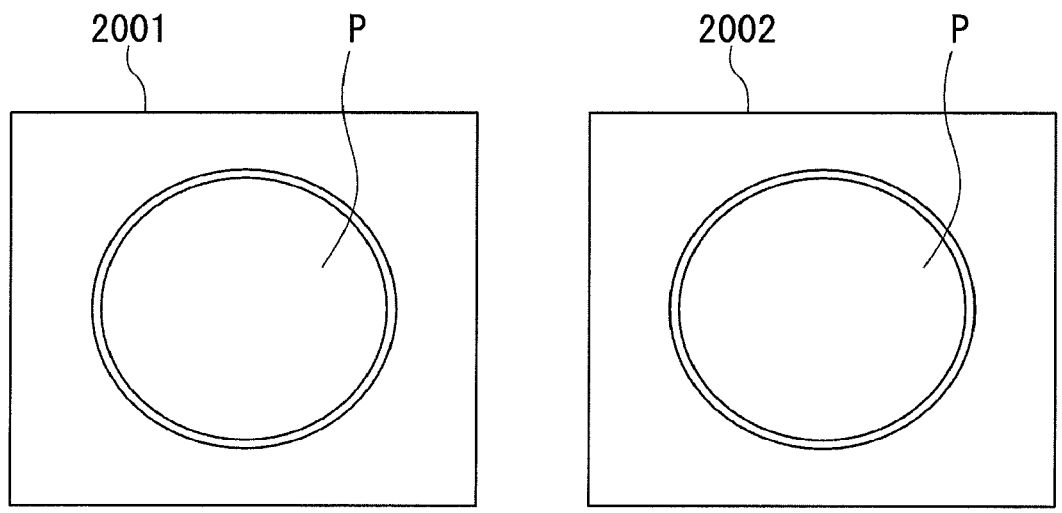
FIG. 24 is a view showing an example of a substrate stage.

Furthermore, in each embodiment described above, the exposure apparatus EX may be an exposure apparatus of a twin stage type which includes a plurality of substrate stages, as disclosed in U.S. Pat. No. 6,341,007, U.S. Pat. No. 6,208,407, U.S. Pat. No. 6,262,796, or the like. For example, as shown in FIG. 24, when the exposure apparatus EX includes two substrate stages 2001 and 2002, the object which is able to be arranged so as to be opposite to the emitting surface 12 includes at least one of one substrate stage, a substrate which is held by a first holding portion of the one substrate stage, and another substrate stage, a substrate which is held by a first holding portion of the another substrate stage.

Moreover, the exposure apparatus EX may be an exposure apparatus which includes the plurality of substrate stages and measurement stages.

The exposure apparatus EX may be an exposure apparatus for manufacturing a semiconductor element which exposes a semiconductor element pattern on the substrate P, an exposure apparatus for manufacturing a liquid crystal display element or a display, or an exposure apparatus for manufacturing a thin film magnetic head, an imaging element (CCD), a micromachine, a MEMS, a DNA chip, or a reticle or mask, or the like.

Moreover, in each embodiment described above, the light transmission type mask is used in which a predetermined light shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. Moreover, instead of the variable molding masks which include a non-light emission type image display element, a pattern-forming apparatus which includes a self light-emission type image display element may be provided.

In each embodiment described above, the exposure apparatus EX includes the projection optical system PL. However, the components explained in each embodiment described above may be applied to an exposure apparatus and an exposing method which do not use the projection optical system PL. For example, the components explained in each embodiment described above may be applied to an exposure apparatus and an exposing method in which the liquid immersion space is formed between an optical member such as a lens and the substrate and the exposure light is radiated to the substrate via the optical member.

Moreover, for example, the exposure apparatus EX may be an exposure apparatus (a lithography system) in which interference fringes are formed on the substrate P, and thus, a line-and-space pattern is exposed on the substrate P, as disclosed in PCT International Publication No. WO 2001/035168.

The exposure apparatuses EX of the above-described embodiments are manufactured by assembling various subsystems including each above-described component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. Of course, the respective assembly processes of each subsystem are needed before the assembly process from various subsystems to the exposure apparatus. After the assembly process of exposure apparatus by various subsystems is finished, a general adjustment is performed, and thus, various accuracies in the overall exposure apparatus are secured. Moreover, it is preferable that the manufacturing of the exposure apparatus be performed in a clean room in which temperature, a degree of cleanness, or the like is controlled.

Figure 26:
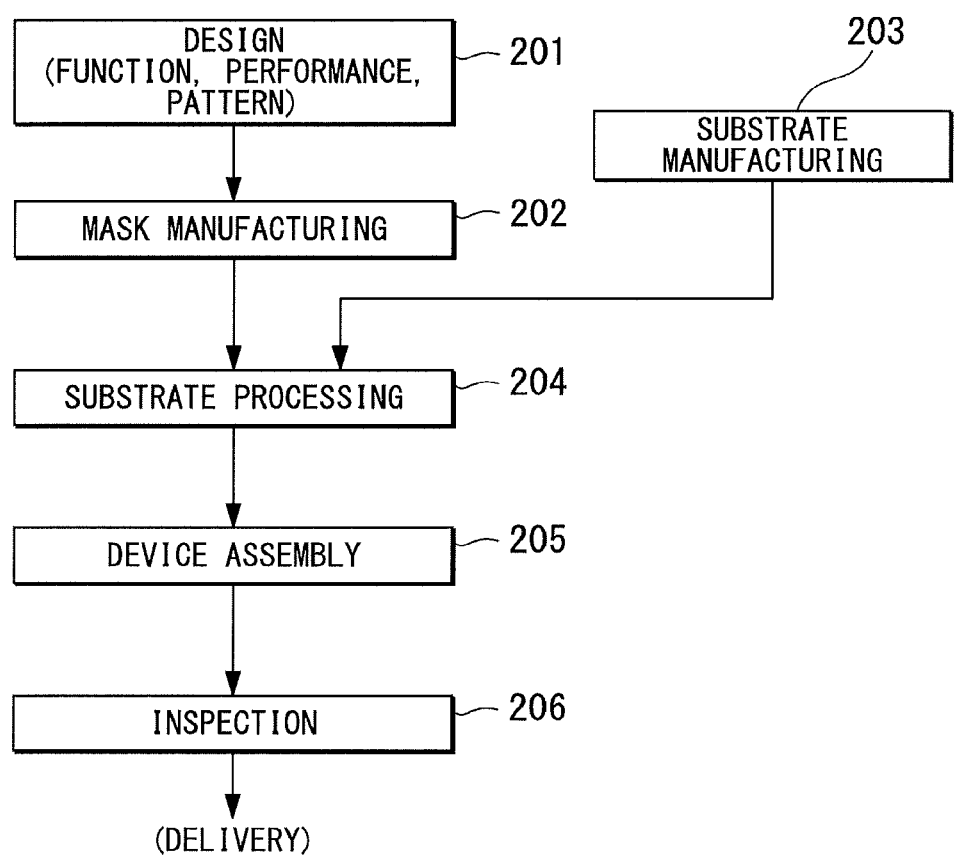
FIG. 26 is a flowchart for explaining an example of a method for manufacturing a device.

As shown in FIG. 26, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate processing step 204 which includes the substrate processing (exposure processing) including exposing the substrate by the exposure light from the pattern of the mask and developing the exposed substrate according to the above-described embodiments, a device assembly step (which includes manufacturing processes such as a dicing process, a bonding process, and a package process) 205, an inspection step 206, or the like.

Moreover, the aspects of each embodiment described above may be appropriately combined. Furthermore, some components may not be used. Moreover, as long as legally permitted, the disclosures of all publications and United States Patents with respect to the exposure apparatuses or the like cited in the each of the above-mentioned embodiment and modifications are incorporated in the disclosures of the present application.

What is claimed is:

1. A liquid immersion exposure apparatus comprising:
a projection system having a final element;
a controller having a central processor; and
a liquid immersion member that forms a liquid immersion space under the final element,
wherein:
the liquid immersion member includes a first member that surrounds the final element and that has a liquid supply port, a first recovery part and an outer surface;
the liquid immersion member includes a second member under which a portion of the liquid immersion space is formed,
the controller is configured to control the second member to move with respect to the first member in a moving direction substantially perpendicular to an optical axis of the final element, the second member having a second recovery part and an inner surface opposite to the outer surface of the first member,
the controller is configured to change a distance between the inner surface and the outer surface by moving the second member in the moving direction;
during exposure of a plurality of shot regions of a substrate including first and second shot regions, the immersion space covers a portion of a surface of the substrate, while recovering liquid via the second recovery part from a gap between the second member and the substrate;
the first shot region is exposed while moving the substrate in a first scanning direction;
after the exposure of the first shot region, the second shot region is exposed while moving the substrate in a second scanning direction substantially opposite to the first scanning direction;
during a stepping period after finishing the exposure of the first shot region but before starting the exposure of the second shot region, the substrate is moved in a stepping direction containing a component crossing the first scanning direction;
the controller is configured to move the second member, during the stepping period, in the moving direction containing the component crossing the first scanning direction such that a relative speed between the second member and the substrate becomes lower than a relative speed between the first member and the substrate; and
the controller is configured to start moving the second member in the moving direction at a different time than that at which the substrate starts moving in the stepping direction.

2. The apparatus according to claim 1, wherein the controller starts moving the second member in the moving direction before the substrate starts moving in the stepping direction.

3. The apparatus according to claim 1, wherein the controller starts moving the second member in the moving direction before the exposure of the first shot region is finished.

4. The apparatus according to claim 1, wherein a maximum speed of the substrate in the stepping direction is greater than a maximum speed of the second member in the moving direction.

5. The apparatus according to claim 4, wherein during the stepping period, the maximum speeds of the substrate and the second member are reached at about the same time.

6. The apparatus according to claim 1, wherein during the exposure of the second shot region, the controller moves the second member in a direction opposite to the moving direction.

7. The apparatus according to claim 1, wherein at the end of the stepping period, neither the substrate nor the second member moves in the stepping direction or the moving direction, respectively.

8. The apparatus according to claim 1, wherein during the stepping period, the controller controls the second member to accelerate in the moving direction more gradually than the substrate is accelerated in the stepping direction.

9. The apparatus according to claim 1, wherein during the stepping period, the controller controls the second member to move less in the moving direction than the substrate is moved in the stepping direction.

10. A method of manufacturing a device, the method comprising:
exposing a plurality of shot regions of a substrate with the liquid immersion exposure apparatus of claim 1; and
developing the exposed substrate.

11. A liquid immersion exposure apparatus comprising:
a projection system having a final element;
a controller having a central processor; and
a liquid immersion member that forms a liquid immersion space under the final element,
wherein:
the liquid immersion member includes a first member that surrounds the final element and that has a liquid supply port, a first recovery part and an outer surface;

the liquid immersion member includes a second member under which a portion of the liquid immersion space is formed, the controller is configured to control the second member to move with respect to the first member in a moving direction substantially perpendicular to an optical axis of the final element, the second member having a second recovery part and an inner surface opposite to the outer surface of the first member, and a distance between the inner surface and the outer surface being changed by moving the second member in the moving direction;

during exposure of a plurality shot regions of a substrate including first and second shot regions, the immersion space covers a portion of a surface of the substrate, while recovering liquid via the second recovery part from a gap between the second member and the substrate;

the first shot region is exposed while moving the substrate in a first scanning direction;

after the exposure of the first shot region, the second shot region is exposed while moving the substrate in a second scanning direction substantially opposite to the first scanning direction;

during a stepping period after finishing the exposure of the first shot region but before starting the exposure of the second shot region, the substrate is moved in a stepping direction containing a component crossing the first scanning direction;

the controller is configured to move the second member, during the stepping period, in the moving direction containing the component crossing the first scanning direction such that a relative speed between the second member and the substrate becomes lower than a relative speed between the first member and the substrate; and the controller is configured to start moving the second member in the moving direction before the exposure of the first shot region is finished.

12. The apparatus according to claim 11, wherein the controller starts moving the second member in the moving direction before the substrate in the stepping direction.

13. The apparatus according to claim 11, wherein the controller starts moving the second member in the moving direction before the exposure of the first shot region is finished.

14. The apparatus according to claim 11, wherein a maximum speed of the substrate in the stepping direction is greater than a maximum speed of the second member in the moving direction.

15. The apparatus according to claim 14, wherein during the stepping period, the maximum speeds of the substrate and the second member are reached at about the same time.

16. The apparatus according to claim 11, wherein during the exposure of the second shot region, the controller moves the second member moves in a direction opposite to the moving direction.

17. The apparatus according to claim 11, wherein at the end of the stepping period, neither the substrate nor the second member moves in the stepping direction or the moving direction, respectively.

18. The apparatus according to claim 11, wherein during the stepping period, the controller controls the second member to accelerate in the moving direction more gradually than the substrate is accelerated in the stepping direction.

19. The apparatus according to claim 11, wherein during the stepping period, the controller controls the second member to move less in the moving direction than the substrate is moved in the stepping direction.

20. A method of manufacturing a device, the method comprising:

exposing a plurality of shot regions of a substrate with the liquid immersion exposure apparatus of claim 11; and developing the exposed substrate.

21. A liquid immersion exposure method comprising:

forming a liquid immersion space under a final element of a projection system by using a liquid immersion member, and sequentially exposing a plurality of shot regions of a substrate via the liquid immersion space with an exposure beam from the projection system, wherein:

the liquid immersion member includes a first member that is configured to surround the final element and that has a liquid supply port, a first recovery part and an outer surface;

the liquid immersion member is configured to include a second member under which a portion of the liquid immersion space is formed, the second member is configured to be moved with respect to the first member in a moving direction substantially perpendicular to an optical axis of the final element, the second member having a second recovery part and an inner surface opposite to the outer surface of the first member such that a distance between the inner surface and the outer surface is changed, during exposure of the plurality of shot regions of the substrate including first and second shot regions, the immersion space is configured to cover a portion of a surface of the substrate, while recovering liquid via the second recovery part from a gap between the second member and the substrate;

exposing the first shot region while moving the substrate in a first scanning direction;

after the exposure of the first shot region, exposing the second shot region while moving the substrate in a second scanning direction substantially opposite to the first scanning direction;

moving the substrate, during a stepping period after finishing the exposure of the first shot region but before starting the exposure of the second shot region, in a stepping direction containing a component crossing the first scanning direction;

moving the second member, during the stepping period, in the moving direction containing the component crossing the first scanning direction such that a relative speed between the second member and the substrate becomes lower than a relative speed between the first member and the substrate; and start moving the substrate in the stepping direction at a different time than that at which the second member starts being moved in the moving direction.

22. The method according to claim 21, further comprising start moving the second member in the moving direction before the substrate starts moving in the stepping direction.

23. The method according to claim 21, further comprising moving the second member in the moving direction before the exposure of the first shot region is finished.

24. The method according to claim 21, further comprising, during the exposure of the second shot region, moving the second member in a direction opposite to the moving direction.

25. The method according to claim 21, wherein at the end of the stepping period, neither the substrate nor the second member moves in the stepping direction or the moving direction, respectively.

26. A liquid immersion exposure method comprising:
forming a liquid immersion space under a final element of a projection system by using a liquid immersion member, and
sequentially exposing a plurality of shot regions of a substrate via the liquid immersion space with an exposure beam from the projection system,
wherein:
the liquid immersion member includes a first member that surrounds the final element and that has a liquid supply port, a first recovery part and an outer surface;
the liquid immersion member includes a second member under which a portion of the liquid immersion space is formed,
the second member is configured to be moved with respect to the first member in a moving direction substantially perpendicular to an optical axis of the final element, the second member having a second recovery part and an inner surface opposite to the outer surface of the first member, and a distance between the inner surface and the outer surface being changed by moving the second member in the moving direction;
during exposure of the plurality shot regions of the substrate including first and second shot regions, the immersion space is configured to cover a portion of a surface of the substrate, while recovering liquid via the second recovery part from a gap between the second member and the substrate;
exposing the first shot region while moving the substrate in a first scanning direction;
after the exposure of the first shot region, exposing the second shot region while moving the substrate in a second scanning direction substantially opposite to the first scanning direction;
moving the substrate, during a stepping period after finishing the exposure of the first shot region but before starting the exposure of the second shot region, in a stepping direction containing a component crossing the first scanning direction;
moving the second member, during the stepping period, in the moving direction containing the component crossing the first scanning direction such that a relative speed between the second member and the substrate becomes lower than a relative speed between the first member and the substrate; and
start moving the second member in the moving direction before the exposure of the first shot region is finished.

27. The method according to claim 26, further comprising start moving the second member in the moving direction before the substrate starts moving in the stepping direction.

28. The method according to claim 26, further comprising start moving the second member in the moving direction before the exposure of the first shot region is finished.

29. The method according to claim 26, further comprising, during the exposure of the second shot region, moving second member in a direction opposite to the moving direction.

30. The method according to claim 26, wherein at the end of the stepping period, neither the substrate nor the second member moves in the stepping direction or the moving direction, respectively.

* * * * *